United States Patent
Takeuchi

(10) Patent No.: US 12,199,023 B2
(45) Date of Patent: Jan. 14, 2025

(54) BALL GRID ARRAY FOR A SEMICONDUCTOR INTEGRATED CIRCUIT DEVICE

(71) Applicant: SEIKO EPSON CORPORATION, Tokyo (JP)

(72) Inventor: Katsuo Takeuchi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 731 days.

(21) Appl. No.: 17/464,874

(22) Filed: Sep. 2, 2021

(65) Prior Publication Data

US 2022/0077042 A1    Mar. 10, 2022

(30) Foreign Application Priority Data

Sep. 4, 2020  (JP) ................................. 2020-149102

(51) Int. Cl.
   *H01L 23/498* (2006.01)
   *G06F 13/42* (2006.01)
   *H01L 23/00* (2006.01)
   *H05K 1/11* (2006.01)

(52) U.S. Cl.
   CPC .... *H01L 23/49816* (2013.01); *G06F 13/4282* (2013.01); *H01L 24/14* (2013.01); *H05K 1/11* (2013.01); *G06F 2213/0042* (2013.01)

(58) Field of Classification Search
   CPC ......... H01L 23/49816; H01L 23/49838; H01L 24/14; H01L 24/32; H01L 24/48; H01L 24/73; H01L 2224/32225; H01L 2224/48091; H01L 2224/48227; H01L 2224/73265; H01L 2924/00014; H01L 2924/14; H01L 2924/15311; H01L 2924/181; H05K 1/11; G06F 13/4282; G06F 2213/0042; H04B 3/32; H04J 1/12; H04J 3/10

See application file for complete search history.

(56) References Cited

U.S. PATENT DOCUMENTS

| | | | |
|---|---|---|---|
| 2012/0068339 A1* | 3/2012 | Miller | H01L 23/49838 257/738 |
| 2017/0033070 A1 | 2/2017 | Betsui et al. | |
| 2018/0068971 A1* | 3/2018 | Betsui | H01L 23/48 |
| 2019/0115292 A1* | 4/2019 | Morrison | H01L 23/49827 |

FOREIGN PATENT DOCUMENTS

| | | |
|---|---|---|
| JP | 2000-349192 A | 12/2000 |
| JP | 2017-034092 A | 2/2017 |

* cited by examiner

*Primary Examiner* — Marcos D. Pizarro
*Assistant Examiner* — Tiberiu Dan Onuta
(74) *Attorney, Agent, or Firm* — Global IP Counselors, LLP

(57) ABSTRACT

An electronic apparatus includes an integrated circuit board on, over, or in which a USB circuit block is provided; a first USB interface; a second USB interface; a printed circuit board on which a source clock circuit configured to output a source clock is provided; and a ball grid array that includes first, second, and third ball grids for electric coupling between the integrated circuit board and the printed circuit board. The first ball grid electrically couples the USB circuit block and the first USB interface to each other. The second ball grid electrically couples the USB circuit block and the second USB interface to each other. The third ball grid electrically couples the source clock circuit and the USB circuit block to each other. The third ball grid is located between the first ball grid and the second ball grid.

12 Claims, 15 Drawing Sheets

BALL GRID ARRAY FOR A SEMICONDUCTOR INTEGRATED CIRCUIT DEVICE

The present application is based on, and claims priority from JP Application Serial Number 2020-149102, filed Sep. 4, 2020, the disclosure of which is hereby incorporated by reference herein in its entirety.

BACKGROUND

1. Technical Field

Embodiments of the present disclosure relate to an electronic apparatus and a semiconductor integrated circuit device.

2. Related Art

These days, thanks to the advancement of technology for higher degree of semiconductor integration and more sophisticated functions thereof, semiconductor integrated circuit devices having many functions such as SoC (System on Chip) and FPGA (Field-Programmable Gate Array) offering many functions built in a single semiconductor chip, and electronic apparatuses equipped with such semiconductor integrated circuit devices, are in widespread use. Such a semiconductor integrated circuit device having many functions requires many terminals for inputting and outputting signals corresponding to the functions. To meet this necessity, so-called ball grid array (BGA), which enables a larger number of terminals to be arranged by adopting a grid matrix layout of the terminals (ball grid), is widely used.

However, in semiconductor integrated circuit devices having BGA architecture according to related art, because of narrow pitch terminal arrangement, the risk of occurrence of electrical crosstalk, etc. between terminals is high, which might cause the malfunction of the semiconductor integrated circuit device.

In an attempt to provide a solution to this issue, JP-A-2000-349192 discloses a technique for reducing the influence of electrical crosstalk by shielding signal wiring about which there is a fear of electrical crosstalk, on a semiconductor integrated circuit device with a BGA, and on a printed wiring board.

However, in the technique disclosed in JP-A-2000-349192, an additional plurality of terminals for shielding the signal wiring about which there is a fear of electrical crosstalk is necessary. This makes it more difficult to reduce the size of the semiconductor integrated circuit device. Recently, technology regarding USB (Universal Serial Bus) communication has been advancing rapidly, with its speed getting faster and faster. Therefore, there is a demand for reducing the risk that signals used for USB communication will be affected by noise such as electrical crosstalk. While there is such a demand on one front, on another front, many types of a semiconductor integrated circuit device and an electronic apparatus are equipped with a plurality of terminals for USB communication on a single device body, and, accordingly, the number of terminals for USB communication provided on such a semiconductor integrated circuit device inevitably increases.

Such a semiconductor integrated circuit device and an electronic apparatus having USB communication functions are demanded to offer improved USB communication signal precision without sacrificing the ease of reducing the device size. Namely, in a semiconductor integrated circuit device and an electronic apparatus having USB communication functions, in related art, there is a room for improvement for offering greater USB communication signal precision without sacrificing the ease of reducing the device size.

SUMMARY

An electronic apparatus according to a certain aspect of the present disclosure includes: an integrated circuit board on, over, or in which a USB circuit block is provided; a first USB interface; a second USB interface; a printed circuit board on which first connection wiring electrically coupled to the first USB interface, second connection wiring electrically coupled to the second USB interface, and a source clock circuit configured to output a source clock are provided; and a ball grid array that includes a first ball grid, a second ball grid, and a third ball grid for electric coupling between the integrated circuit board and the printed circuit board; wherein the first ball grid electrically couples the USB circuit block and the first USB interface to each other via the first connection wiring, the second ball grid electrically couples the USB circuit block and the second USB interface to each other via the second connection wiring, the third ball grid electrically couples the source clock circuit and the USB circuit block to each other, and the third ball grid is located between the first ball grid and the second ball grid.

A semiconductor integrated circuit device according to a certain aspect of the present disclosure is configured to be electrically coupled to a printed circuit board, and includes: an integrated circuit board on, over, or in which a USB circuit block is provided; and a ball grid array for electric coupling between the integrated circuit board and the printed circuit board; wherein the ball grid array includes a first ball grid, a second ball grid, and a third ball grid, the first ball grid is electrically coupled to the USB circuit block, the second ball grid is electrically coupled to the USB circuit block, a source clock supplied to the USB circuit block flows through the third ball grid, and the third ball grid is located between the first ball grid and the second ball grid.

DESCRIPTION OF EXEMPLARY EMBODIMENTS

With reference to the accompanying drawings, a certain non-limiting advantageous embodiment of the present disclosure will now be explained. The drawings will be referred to in order to facilitate an explanation. The specific embodiment described below shall never be construed to unduly limit the scope of the present disclosure recited in the appended claims. Not all of components described below necessarily constitute indispensable parts of the present disclosure. In the present embodiment, for the purpose of explanation, a printing apparatus will be taken as an example of an electronic apparatus according to the present disclosure. However, the electronic apparatus is not limited to a printing apparatus. For example, the present disclosure may be applied to various electronic apparatuses such as a personal computer, a projector, a television, and the like.

1. First Embodiment 1.1 Structure of Printing Apparatus

Figure 1:
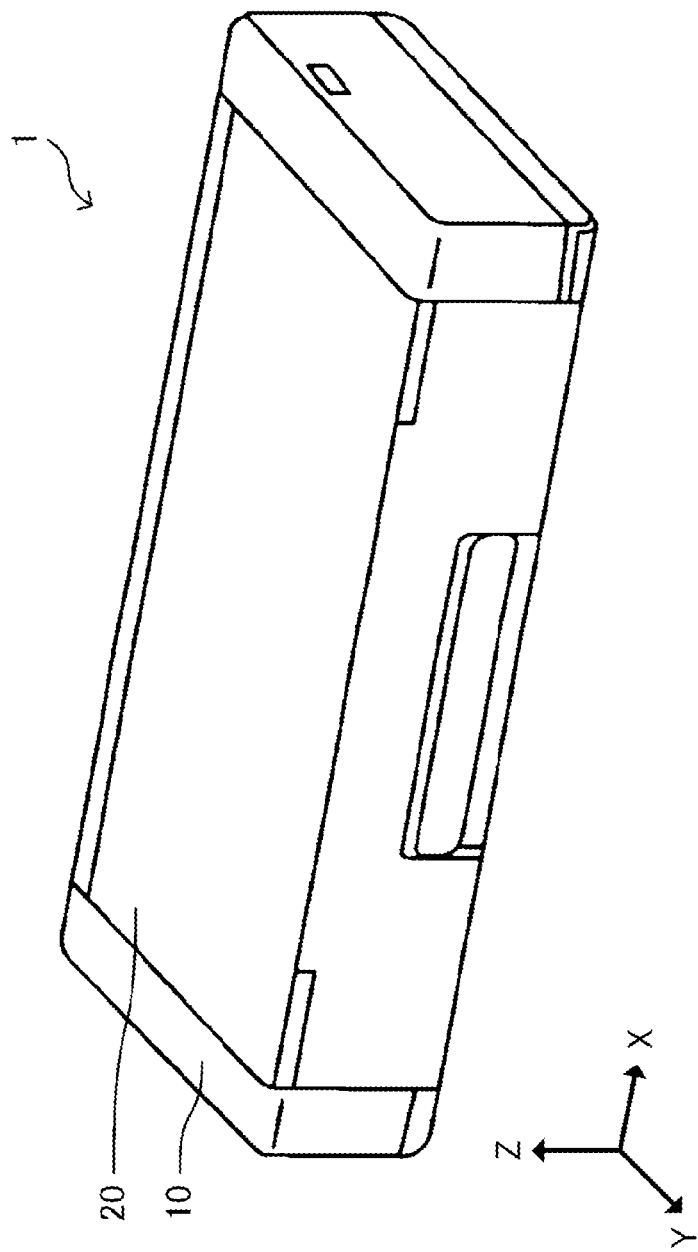
FIG. 1 is a perspective view, taken from the +Y side, of a printing apparatus.
Figure 2:
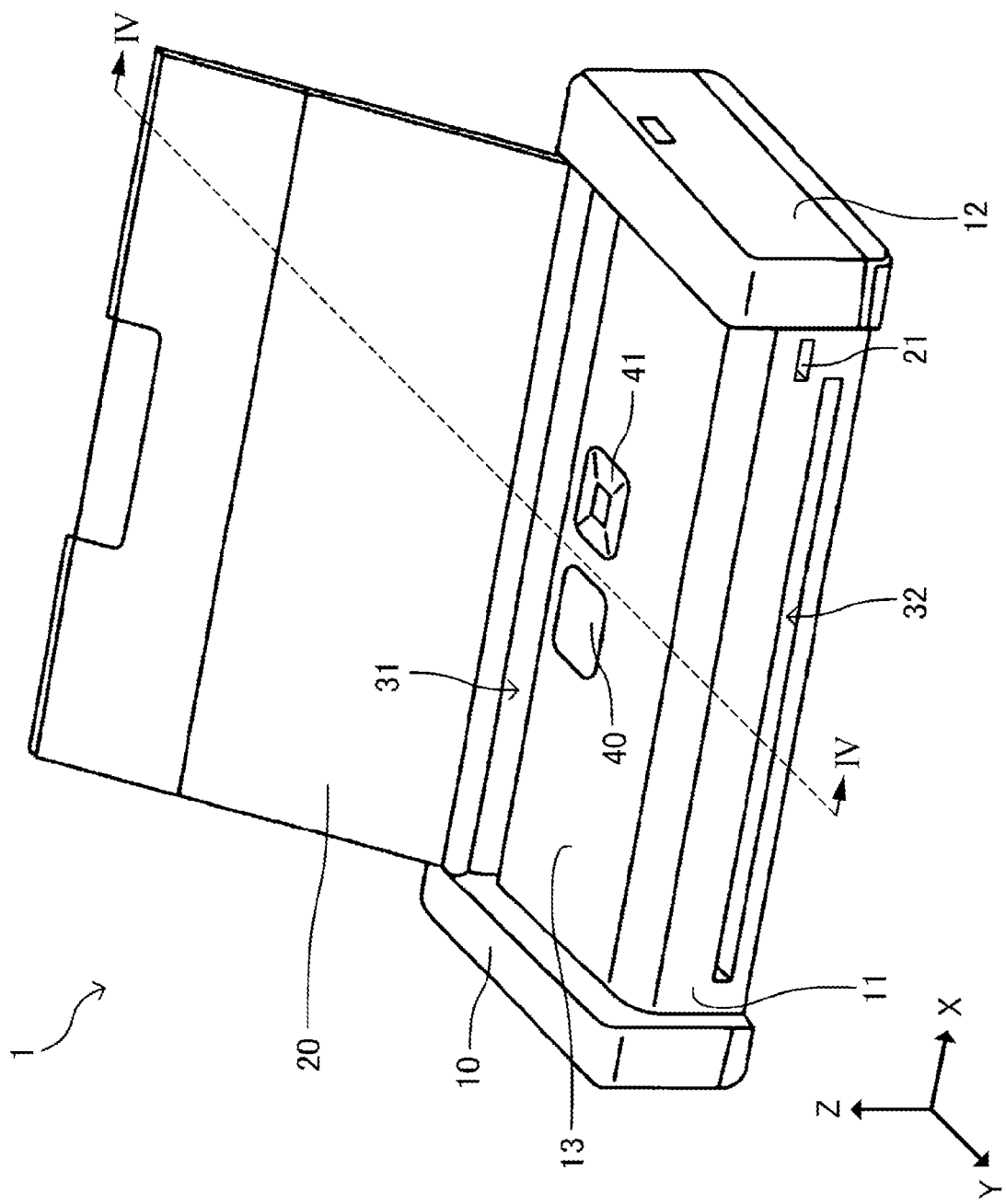
FIG. 2 is a perspective view, taken from the +Y side, of the printing apparatus when a cover of the printing apparatus is open.
Figure 3:
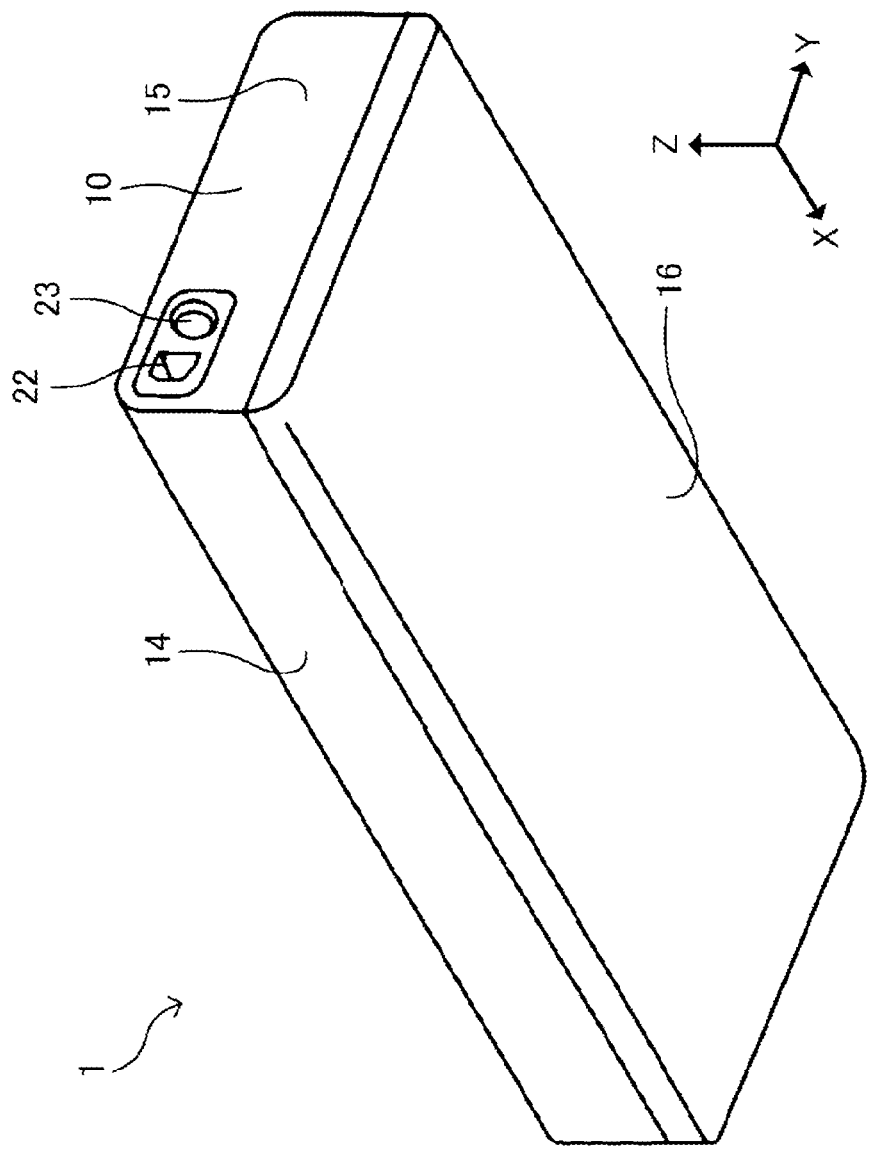
FIG. 3 is a perspective view, taken from the −Y side, of the printing apparatus.

With reference to FIGS. 1, 2, and 3, an external structure of a printing apparatus 1 that is an example of an electronic apparatus will now be explained. The description below will be given while referring to X, Y, and Z directions that are orthogonal to one another. The side indicated by the tail of the X-directional arrow may be referred to as "−X side", and the side indicated by the head of the X-directional arrow may be referred to as "+X side". The side indicated by the tail of the Y-directional arrow may be referred to as "−Y side", and the side indicated by the head of the Y-directional arrow may be referred to as "+Y side". The side indicated by the tail of the Z-directional arrow may be referred to as "−Z side", and the side indicated by the head of the Z-directional arrow may be referred to as "+Z side". Although the X, Y, and Z directions are assumed to be orthogonal to one another in the description below, the components of the printing apparatus 1 are not necessarily orthogonal to one another.

FIG. 1 is a perspective view, taken from the +Y side, of the printing apparatus 1. FIG. 2 is a perspective view, taken from the +Y side, of the printing apparatus 1 when a cover 20 of the printing apparatus 1 is open. FIG. 3 is a perspective view, taken from the −Y side, of the printing apparatus 1. As illustrated in FIG. 1, the printing apparatus 1 includes a housing 10 and a cover 20. The cover 20 is located on the +Z side with respect to the housing 10 and is able to opened and closed.

As illustrated in FIGS. 2 and 3, the housing 10 includes a wall portion 11 located on the +Y side, a wall portion 12 located on the +X side, a wall portion 13 located on the +Z side, a wall portion 14 located on the −Y side, a wall portion 15 located on the −X side, and a wall portion 16 located on the −Z side, and has a shape of a substantially rectangular parallelepiped with an internal housing space. The printing apparatus 1 is installed such that the wall portion 16 is oriented toward the floor and is used in this state. That is, the wall portion 16 of the housing 10 serves as the bottom of the printing apparatus 1, and corresponds to an installation surface.

A display unit 40 and an operation interface 41 are provided on the wall portion 13. The display unit 40 is, for example, a display panel such as a liquid crystal panel, an electronic paper panel, an organic electroluminescence panel, or the like. Various kinds of information based on the operation and status of the printing apparatus 1 are displayed on the display unit 40. In addition to the display panel mentioned above, the display unit 40 may include indicators such as LEDs indicating the status of power activation of the printing apparatus 1 and the status of transmission of various kinds of data to the printing apparatus 1. The operation interface 41 receives various kinds of operation by a user who uses the printing apparatus 1. That is, based on the operation of the operation interface 41 by the user, the printing apparatus 1 is able to perform various kinds of processing. The printing apparatus 1 may be equipped with a touch-sensitive panel that is an integrated combination of the display unit 40 and the operation interface 41.

As illustrated in FIG. 2, the wall portion 11 has a USB (Universal Serial Bus) connection terminal 21 for performing communication with various kinds of apparatus provided outside the printing apparatus 1. As illustrated in FIG. 3, the wall portion 15 has a USB connection terminal 22 for performing communication with the outside of the printing apparatus 1. Examples of an apparatus connectable to the USB connection terminal 21, 22 include an external apparatus such as a personal computer, a digital camera, and the like and an external storage medium storing image data, etc. In the description below, when it is unnecessary to distinguish an external apparatus such as a personal computer, a digital camera, and the like from an external storage medium storing image data, the external apparatus and the external storage medium may be referred to as "external equipment, etc." The USB connection terminal 21, 22 is a connector to which a cable for USB communication is connectable. The USB connection terminal 21, 22 may be any of a USB connector, a mini USB connector, a micro USB connector, and the like.

As illustrated in FIG. 3, the wall portion 15 further has a power terminal 23 into which an alternating-current voltage AC available from a commercial power source is inputted. For example, the power terminal 23 is configured as an inlet socket. The power terminal 23 is not limited to an inlet socket into which an alternating-current voltage AC is inputted. For example, the power terminal 23 may be a DC plug to which an AC adapter provided externally is connectable. In this case, a direct-current voltage converted from an alternating-current voltage by the AC adapter may be supplied to the power terminal 23.

A supply port 31 through which a medium is supplied into the inside of the housing 10 is provided on the −Y side of the wall portion 13. The wall portion 11 has an exit port 32 through which the medium having been supplied into the inside of the housing 10 goes out. The medium having been supplied through the supply port 31 is transported inside the housing 10, and ink is ejected in synchronization with the timing of transportation of the medium. The ink ejected in the form of droplets lands onto the surface of the medium. As a result, an image is formed. The medium, with the image formed thereon, goes out through the exit port 32.

Figure 4:
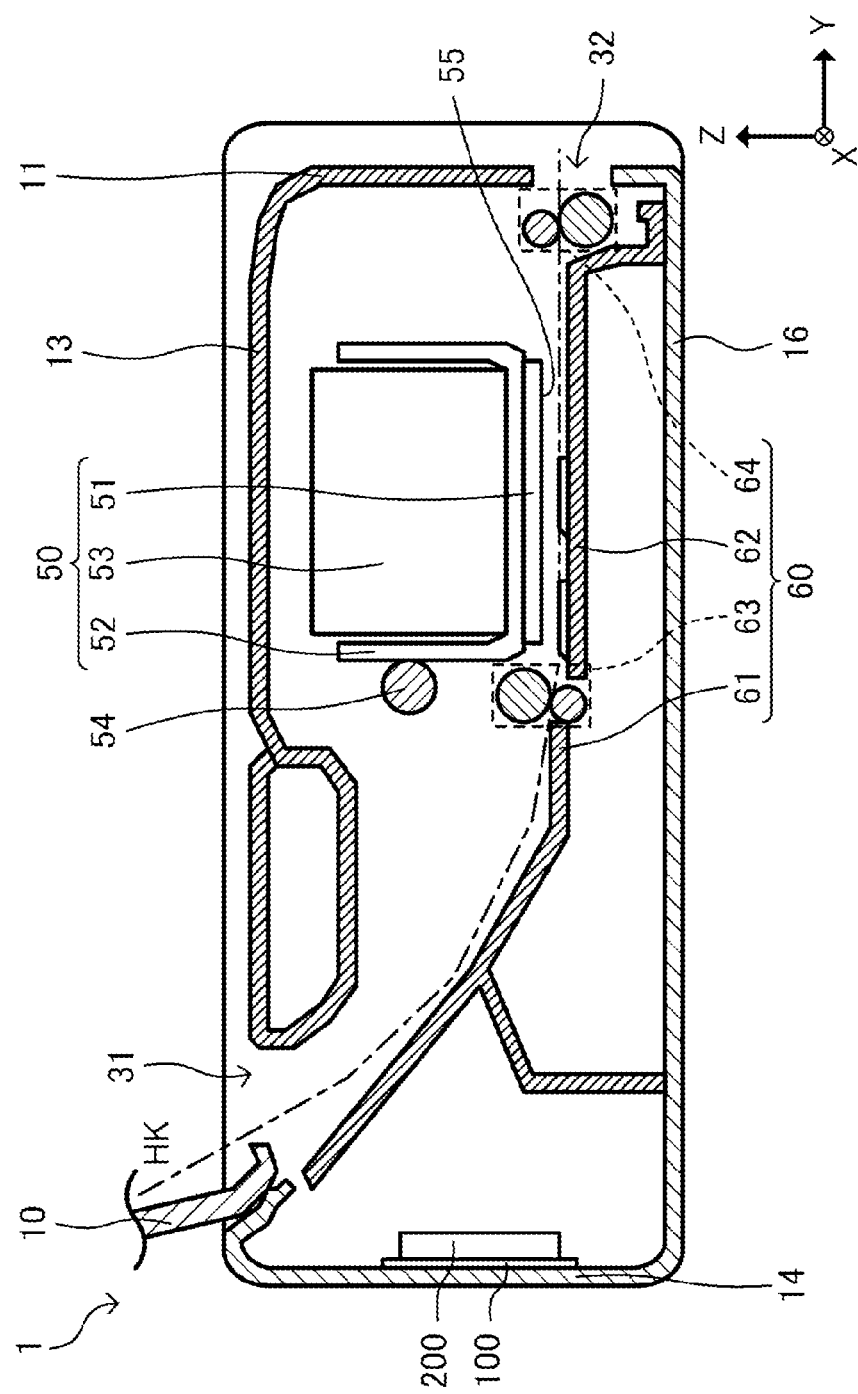
FIG. 4 is a sectional view of the printing apparatus taken along the line IV-IV of FIG. 2.

With reference to FIG. 4, an internal structure inside the housing 10, inside which the medium is transported, will now be explained. FIG. 4 is a sectional view of the printing apparatus 1 taken along the line IV-IV of FIG. 2. As illustrated in FIG. 4, the printing apparatus 1 includes a head unit 50, a transportation unit 60, and a printed circuit board 100 inside the housing 10.

The head unit 50 includes an ejection head 51, a carriage 52, and a liquid containing portion 53. The carriage 52 is supported at its-Y side by a carriage guide shaft 54 in such a way as to be able to reciprocate. The carriage 52 reciprocates in a main scan direction that is along the X direction while being supported by the carriage guide shaft 54.

The liquid containing portion 53 is located on the +Z side with respect to the carriage 52. Ink that is to be ejected from nozzles of the ejection head 51 is contained in the liquid containing portion 53. The ejection head 51 is mounted on the carriage 52 at the −Z side of the carriage 52. The liquid containing portion 53 is in communication with the ejection head 51 via a liquid flow passage that is not illustrated. Through this non-illustrated passage, the ink contained in the liquid containing portion 53 is supplied to the ejection head 51. The ejection head 51 has an ejection face 55 in which the plurality of nozzles for ejecting ink toward the medium is provided. The ejection face 55 is located on the −Z side of the ejection head 51.

The transportation unit 60 includes a medium supporting portion 61, another medium supporting portion 62, a pair of transportation rollers 63, and another pair of transportation rollers 64. The medium supporting portion 61 and the medium supporting portion 62 constitute a transportation path HK for transporting, to the exit port 32, the medium having been supplied through the supply port 31. The medium having been supplied through the supply port 31 is transported along the transportation path HK toward the exit port 32 by the pair of transportation rollers 63 and the pair of transportation rollers 64 that are driven to rotate. Specifically, the medium having been supplied through the supply port 31 is transported from the medium supporting portion 61 toward the medium supporting portion 62 due to the driven operation of the pair of transportation rollers 63. The medium supporting portion 62 is located on the −Z side with respect to the ejection head 51 mounted on the carriage 52. That is, the medium supporting portion 62 and the ejection face 55 of the ejection head 51 mounted on the carriage 52 face each other in the Z direction. In a state in which the medium that is being transported along the transportation path HK is supported by the medium supporting portion 62, ink is ejected from the nozzles provided in the ejection face 55 of the ejection head 51. The ink ejected in the form of droplets lands onto the surface of the medium. As a result, an image is formed.

The printed circuit board 100 is provided on the wall portion 14 of the housing 10 on the −Z side with respect to the transportation path HK. The printed circuit board 100 is a plate-like member extending along the wall portion 14. A plurality of circuits including a semiconductor integrated circuit device 200 is mounted on the printed circuit board 100. The plurality of circuits, including the semiconductor integrated circuit device 200, mounted on the printed circuit board 100 controls the operation of the components of the printing apparatus 1.

1.2 Functional Configuration of Printing Apparatus

Figure 5:
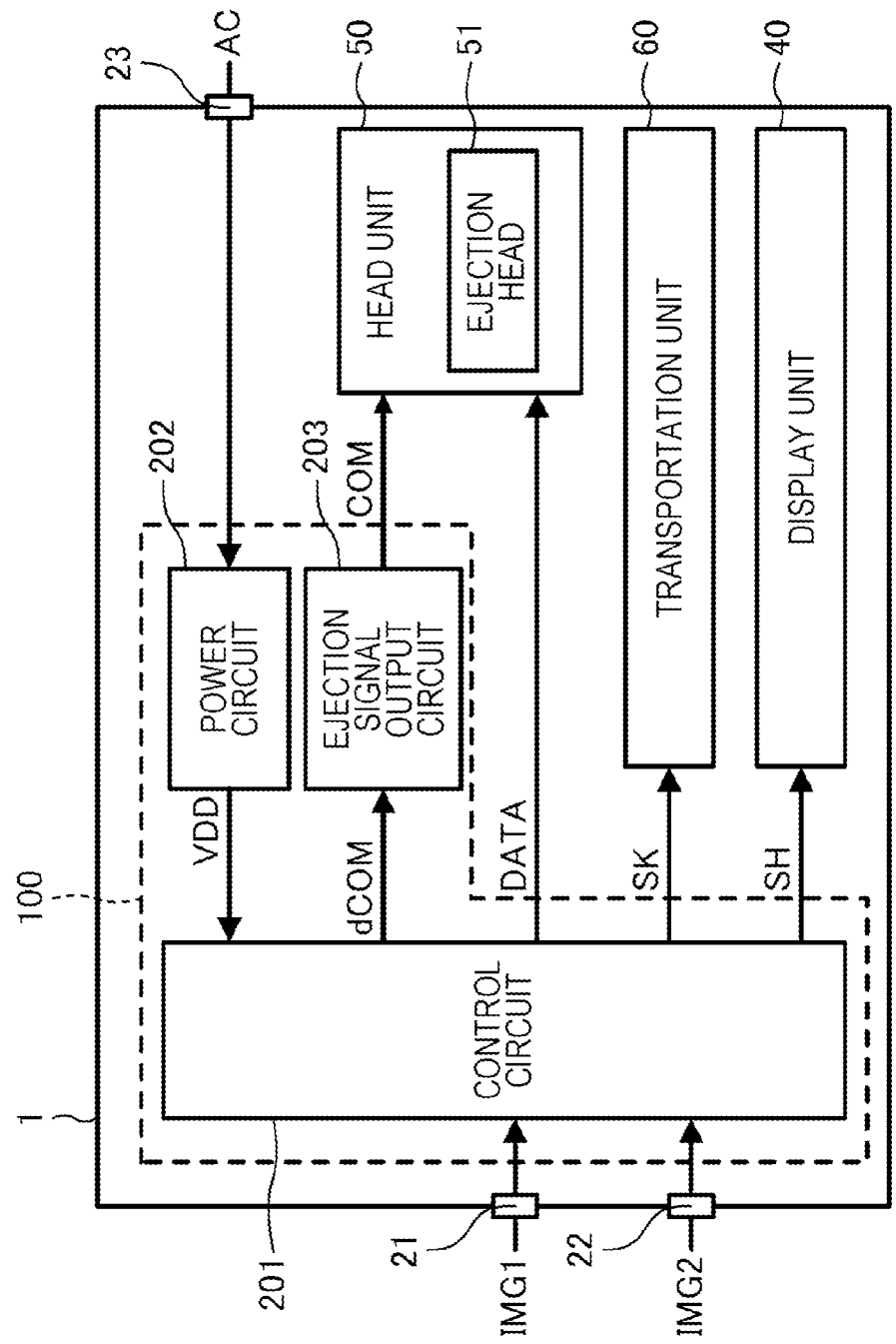
FIG. 5 is a block diagram that illustrates a functional configuration of the printing apparatus.

Next, a functional configuration of the printing apparatus 1 will now be explained. FIG. 5 is a block diagram that illustrates a functional configuration of the printing apparatus 1. As illustrated in FIG. 5, the printing apparatus 1 includes a control circuit 201, a power circuit 202, an ejection signal output circuit 203, the head unit 50, the transportation unit 60, and the display unit 40.

An alternating-current voltage AC such as commercial AC power is inputted into the power circuit 202 from the outside of the printing apparatus 1. The power circuit 202 converts the inputted alternating-current voltage AC into a direct-current voltage having a predetermined voltage value, and outputs the result of conversion as a voltage VDD to the control circuit 201. The power circuit 202 is an AC/DC converter that converts the alternating-current voltage AC into the voltage VDD that is a direct-current voltage. For example, the power circuit 202 performing such AC/DC conversion is a flyback circuit, etc. The voltage VDD generated by the power circuit 202 is supplied as a power voltage for various components of the printing apparatus 1. Therefore, the power circuit 202 may include a voltage-lowering circuit that lowers the voltage VDD and a voltage-raising circuit that raises the voltage VDD. That is, based on the alternating-current voltage AC, the power circuit 202 may generate various signals having various voltage values to be used in the printing apparatus 1, including the voltage VDD, and may supply the generated signals to the corresponding components.

Based on either one or both of an image information signal IMG1 inputted via the USB connection terminal 21 and an image information signal IMG2 inputted via the USB connection terminal 22 from external equipment, etc. provided outside the printing apparatus 1, the control circuit 201 generates various control signals for controlling the operation of the printing apparatus 1 and outputs the generated signals to the corresponding components. By this means, the control circuit 201 controls the operation of the printing apparatus 1. In the description below, when it is unnecessary to distinguish the image information signal IMG1 and the image information signal IMG2 from each other, these signals may be simply referred to as "image information signals IMG".

Specifically, the control circuit 201 generates a waveform specifying signal dCOM that is in a digital signal format for specifying the waveform of an ejection signal COM that is to be outputted from the ejection signal output circuit 203, and then outputs the generated signal to the ejection signal output circuit 203. The ejection signal output circuit 203 converts the inputted waveform specifying signal dCOM into an analog signal and then performs class-D amplification on the converted analog signal, thereby generating an ejection signal COM. The ejection signal COM generated by the ejection signal output circuit 203 is supplied to the head unit 50. The waveform specifying signal dCOM may be any kind of signal as long as it is possible to specify the waveform of the ejection signal COM. The waveform specifying signal dCOM may be an analog signal. It is sufficient as long as the ejection signal output circuit 203 is capable of amplifying the waveform specified by the waveform specifying signal dCOM into predetermined voltage values. The ejection signal output circuit 203 may be a class-A amplifier, a class-B amplifier, a class-AB amplifier, or the like.

The control circuit 201 further generates an ejection control signal DATA for controlling the ejection of ink from the ejection head 51 included in the head unit 50, and outputs the generated signal to the head unit 50. Specifically, the ejection head 51 includes non-illustrated nozzles and non-illustrated drive elements for ejecting ink from the nozzles. At the timing that is based on the ejection control signal DATA supplied from the control circuit 201, the ejection head 51 supplies the ejection signal COM received from the ejection signal output circuit 203 to the drive elements. The drive elements are driven by this signal supply. As a result, ink whose amount corresponds to the driving of the drive elements is ejected from the nozzles of the ejection head 51.

The control circuit 201 further generates a transportation control signal SK for controlling the transportation unit 60, and supplies the generated signal to the transportation unit 60. In accordance with the inputted transportation control signal SK, the transportation unit 60 controls the driving of the pairs of transportation rollers 63 and 64 described above, thereby transporting the medium along the transportation path HK. Then, in synchronization with the timing of transportation of the medium by the transportation unit 60 based on the transportation control signal SK, ink is ejected from the ejection head 51. The ink ejected in the form of droplets lands onto the surface of the medium at a targeted position. As a result, an image is formed as instructed.

In addition to the signals described above, the control circuit 201 generates a display control signal SH for controlling the display of various kinds of information on the display unit 40, and supplies the generated signal to the display unit 40. In accordance with the display control signal SH, the display unit 40 displays various kinds of information such as operation information and status information, etc. of the printing apparatus 1. This display informs the user of the operation status, etc. of the printing apparatus 1.

In the printing apparatus 1 having the configuration described above, the control circuit 201, the power circuit 202, and the ejection signal output circuit 203 are mounted on the printed circuit board 100 described earlier. The control circuit 201 configured to control the operation of the printing apparatus 1 includes, for example, a CPU (Central Processing Unit). Instead of the CPU or in addition to the CPU, the control circuit 201 may include at least one of a DSP (Digital Signal Processor), an ASIC (Application Specific Integrated Circuit), a PLD (Programmable Logic Device), or an FPGA (Field Programmable Gate Array). At least a part of the control circuit 201 described here has, for example, an SoC (System on a Chip) architecture and is configured as the semiconductor integrated circuit device 200 described earlier.

Figure 6:
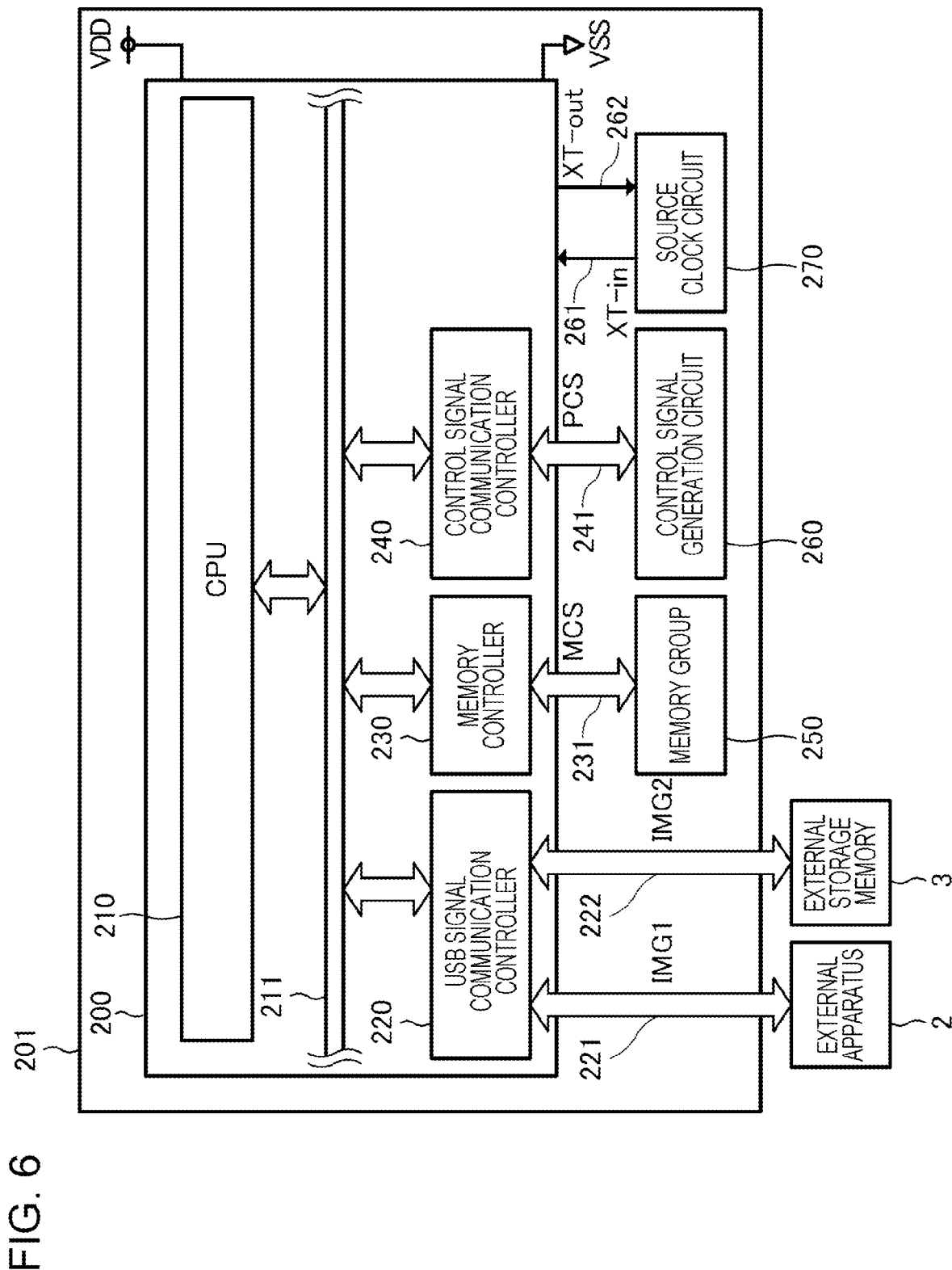
FIG. 6 is a block diagram that illustrates a functional configuration of a control circuit.

1.3 Configuration of Control Circuit
1.3.1 Functional Configuration of Control Circuit With reference to FIG. 6, a functional configuration of the control circuit 201 including the semiconductor integrated circuit device 200 will now be explained. FIG. 6 is a block diagram that illustrates a functional configuration of the control circuit 201. As illustrated in FIG. 6, the control circuit 201 includes the semiconductor integrated circuit device 200, a memory group 250, a control signal generation circuit 260, and a source clock circuit 270.

The semiconductor integrated circuit device 200 includes a CPU 210, a USB signal communication controller 220, a memory controller 230, a control signal communication controller 240, and a bus 211. The semiconductor integrated circuit device 200 operates by using, as its power voltage, a voltage caused by a difference between the level of a voltage VDD outputted from the power circuit 202 and the level of a voltage VSS serving as a reference potential.

Based on the power voltage, the semiconductor integrated circuit device 200 generates a source generation signal XT-out having a predetermined voltage level. Then, the semiconductor integrated circuit device 200 supplies the generated source generation signal XT-out to the source clock circuit 270 via wiring 262 provided on the printed circuit board 100. The source clock circuit 270 includes, for example, a crystal oscillator and an oscillation circuit configured to oscillate the crystal oscillator. The source clock circuit 270 obtains a signal having a predetermined frequency by causing the crystal oscillator to oscillate at a predetermined number of oscillations based on the source generation signal XT-out. Then, the source clock circuit 270 supplies the obtained signal as a source clock signal XT-in to the semiconductor integrated circuit device 200 via wiring 261 provided on the printed circuit board 100. The semiconductor integrated circuit device 200 operates at a timing that is based on the cycle of the source clock signal XT-in supplied, or based on the cycle of a signal obtained by performing frequency division or frequency multiplication of the source clock signal XT-in. That is, the source clock circuit 270 is provided on the printed circuit board 100 and outputs the source clock signal XT-in. The source clock signal XT-in is an example of a source clock.

The bus 211 interconnects the CPU 210, the USB signal communication controller 220, the memory controller 230, and the control signal communication controller 240 in such a way that they can communicate internally.

The USB signal communication controller 220 is electrically coupled to the USB connection terminal 21 via wiring 221 provided on the printed circuit board 100. When external equipment, etc. such as an external apparatus 2 is connected to the USB connection terminal 21, an image information signal IMG1 is inputted from the external apparatus 2 into the USB signal communication controller 220 via the wiring 221. The USB signal communication controller 220 is electrically coupled to the USB connection terminal 22 via wiring 222 provided on the printed circuit board 100. When an external storage memory 3 is connected to the USB connection terminal 22, an image information signal IMG2 is inputted from the external storage memory 3 into the USB signal communication controller 220 via the wiring 222. The external storage memory 3 may be connected to the USB connection terminal 21 in such a way as to be able to perform communication. The external apparatus 2 may be connected to the USB connection terminal 22 in such a way as to be able to perform communication.

Each of the image information signals IMG1 and IMG2 has a differential signal format that conforms to a communication scheme in which data can be transferred at a high frequency of 5 GHz or higher, for example, conforms to a communication scheme of USB 3.0 or newer. That is, the USB signal communication controller 220 is a circuit block supporting a communication scheme in which data can be transferred at a high frequency of 5 GHz or higher. In other words, the USB signal communication controller 220 is a circuit block supporting a communication speed of 5 Gbps or faster. In the description below, one of a pair of differential signals constituting the image information signal IMG1 sent via the wiring 221 may be referred to as "differential signal IMG1+", and the other of the pair of differential signals constituting the image information signal IMG1 sent via the wiring 221 may be referred to as "differential signal IMG1−". Similarly, one of a pair of differential signals constituting the image information signal IMG2 sent via the wiring 222 may be referred to as "differential signal IMG2+", and the other of the pair of differential signals constituting the image information signal IMG2 sent via the wiring 222 may be referred to as "differential signal IMG2−". That is, a pair of wiring lines 221 via which the differential signals IMG1+ and IMG1− are sent and a pair of wiring lines 222 via which the differential signals IMG2+ and IMG2− are sent are provided on the printed circuit board 100.

In the semiconductor integrated circuit device 200, the USB signal communication controller 220 may be configured as a single circuit block that processes the image information signals IMG1 and IMG2 inputted from the USB connection terminals 21 and 22 respectively. Alternatively, the USB signal communication controller 220 may include two or more circuit blocks, including a circuit block that processes the image information signal IMG1 inputted from the USB connection terminal 21 and a circuit block that processes the image information signal IMG2 inputted from the USB connection terminal 22. The USB signal communication controller 220 is an example of a USB circuit block. One of the USB connection terminals 21 and 22 is an example of a first USB interface. The other of the USB connection terminals 21 and 22 is an example of a second USB interface. One of the wiring 221, which is provided on the printed circuit board 100 and via which the USB signal communication controller 220 is electrically coupled to the USB connection terminal 21, and the wiring 222, which is provided on the printed circuit board 100 and via which the USB signal communication controller 220 is electrically coupled to the USB connection terminal 22, is an example of first connection wiring. The other of the wiring 221 and the wiring 222 is an example of second connection wiring.

The image information signal IMG1, IMG2 having been inputted into the USB signal communication controller 220 is inputted into the CPU 210 via the bus 211. Based on the inputted image information signal IMG1, IMG2, the CPU 210 generates a control signal for reading information corresponding thereto out of the memory group 250, and outputs the generated signal to the memory controller 230 via the bus 211.

Based on the control signal inputted from the CPU 210, the memory controller 230 generates a memory control signal MCS for accessing a memory cell where the corresponding information is stored among memory cells included in the memory group 250, and outputs the generated signal to the memory group 250 via wiring 231 provided on the printed circuit board 100. By performing this operation, the memory controller 230 reads out the demanded information stored in the memory group 250, and outputs the read information to the CPU 210. As a result, the demanded information stored in the memory group 250 is supplied to the CPU 210. The memory group 250 may include, for example, a DRAM (Dynamic Random Access Memory), an SRAM (Static Random Access Memory), etc.

Based on the image information signal IMG1, IMG2 inputted via the USB connection terminal 21, 22, and based on the information read out of the memory group 250 by the memory controller 230, the CPU 210 generates a control signal for controlling the operation of the printing apparatus 1. Then, the CPU 210 inputs the generated control signal into the control signal communication controller 240 via the bus 211. Based on the control signal inputted from the CPU 210, the control signal communication controller 240 generates a print control signal PCS that includes various kinds of information for controlling the operation of the printing apparatus 1, and outputs the generated signal to the control signal generation circuit 260 via wiring 241 provided on the printed circuit board 100.

Specifically, based on the print control signal PCS inputted from the semiconductor integrated circuit device 200, the control signal generation circuit 260 generates various signals for controlling the operation of the printing apparatus 1 such as the waveform specifying signal dCOM, the ejection control signal DATA, the transportation control signal SK, the display control signal SH, and the like, and outputs these signals to the corresponding components of the printing apparatus 1. The control signal generation circuit 260 described here may be comprised of a plurality of electronic parts including one or more integrated circuits, or may be configured as a part of the semiconductor integrated circuit device 200.

The print control signal PCS outputted by the control signal communication controller 240 may be, for example, a signal conforming to the UART (Universal Asynchronous Receiver/Transmitter) communication standard or a signal conforming to the I2C (Inter-Integrated Circuit) communication standard. The control signal communication controller 240 may include a plurality of circuit blocks configured to generate and output signals corresponding respectively to the waveform specifying signal dCOM, the ejection control signal DATA, the transportation control signal SK, the display control signal SH, and the like. The print control signal PCS outputted by the control signal communication controller 240 may be comprised of a plurality of signals corresponding respectively to the waveform specifying signal dCOM, the ejection control signal DATA, the transportation control signal SK, the display control signal SH, and the like.

1.3.2 Structure of Semiconductor Integrated Circuit Device

Figure 7:
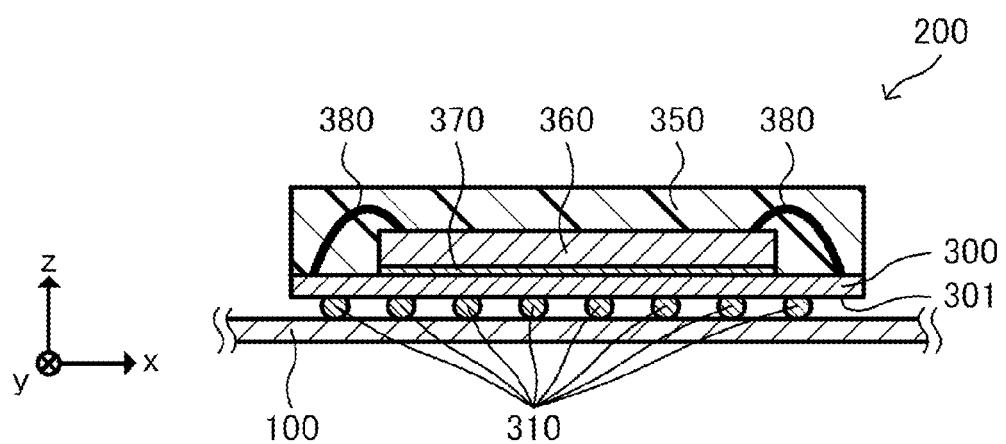
FIG. 7 is a sectional view illustrating a structure of the semiconductor integrated circuit device.

Next, a structure of the semiconductor integrated circuit device 200 will now be explained. FIG. 7 is a sectional view illustrating a structure of the semiconductor integrated circuit device 200. The description below will be given while referring to x, y, and z directions that are orthogonal to one another and are independent of the X, Y, and Z directions illustrated in FIGS. 1 to 4. The side indicated by the tail of the x-directional arrow may be referred to as "−x side", and the side indicated by the head of the x-directional arrow may be referred to as "+x side". The side indicated by the tail of the y-directional arrow may be referred to as "−y side", and the side indicated by the head of the y-directional arrow may be referred to as "+y side". The side indicated by the tail of the z-directional arrow may be referred to as "−z side", and the side indicated by the head of the z-directional arrow may be referred to as "+z side". Although the x, y, and z directions are assumed to be orthogonal to one another in the description below, the components of the semiconductor integrated circuit device 200 are not necessarily orthogonal to one another.

As illustrated in FIG. 7, the semiconductor integrated circuit device 200 includes a base substrate 300, an IC chip 360, and an enclosure 350.

The CPU 210, the USB signal communication controller 220, the memory controller 230, and the control signal communication controller 240 described above are mounted in the IC chip 360.

The base substrate 300 is located on the −z side with respect to the IC chip 360. The IC chip 360 is mounted on the base substrate 300 by means of an adhesion medium 370 such as an adhesive. The base substrate 300 and the IC chip 360 are electrically coupled to each other via bonding wires 380. In other words, the CPU 210, the USB signal communication controller 220, the memory controller 230, and the control signal communication controller 240 are provided over the base substrate 300.

A plurality of wiring patterns including wiring patterns pIMG1+, pIMG1−, pIMG2+, pIMG2−, pXT-in, and pXT-out, which will be described later, and a plurality of non-illustrated electrodes are provided on the base substrate 300. The bonding wires 380 are electrically connected to non-illustrated electrodes formed on the +z-side surface of the base substrate 300. A plurality of electrodes is provided on the −z-side surface of the base substrate 300. Terminals 310 each of which includes a solder ball are provided respectively on the plurality of electrodes provided on the −z-side surface of the base substrate 300. The base substrate 300 is electrically coupled to the printed circuit board 100 via the terminals 310 each of which includes a solder ball. The plurality of terminals 310 via which the base substrate 300 of the semiconductor integrated circuit device 200 is electrically coupled to the printed circuit board 100 constitute a so-called ball grid array (BGA) that provides electric and mechanical coupling between the base substrate 300 and the printed circuit board 100. That is, the base substrate 300, which is included in the semiconductor integrated circuit device 200 according to the present embodiment, and the printed circuit board 100 of the printing apparatus 1, are electrically coupled to each other via the BGA comprised of the plurality of terminals 310 each including a solder ball. In the description below, the −z-side surface of the base substrate 300, on which the BGA comprised of the plurality of terminals 310 is provided, will be referred to as "terminal mount surface 301".

In the semiconductor integrated circuit device 200 having the configuration described above, signals that have been inputted into the semiconductor integrated circuit device 200 via the plurality of terminals 310 provided on the terminal mount surface 301 flow through the electrodes and wiring patterns that are provided on the base substrate 300 and through the bonding wires 380, and then are inputted into the IC chip 360. Signals that have been outputted from the IC chip 360 flow through the bonding wires 380 and through the electrodes and wiring patterns that are provided on the base substrate 300, and then are outputted to the printed circuit board 100. The base substrate 300, on which the IC chip 360 with the USB signal communication controller 220 mounted therein is provided, is an example of an integrated circuit board. Since the plurality of terminals 310 electrically couples the IC chip 360 and the printed circuit board 100 to each other via the base substrate 300, the IC chip 360 is also an example of an integrated circuit board in a broader sense of the term. Moreover, a combination of the base substrate 300 and the IC chip 360 with the USB signal communication controller 220 mounted therein is also another example of an integrated circuit board in a broader sense of the term.

The enclosure 350 is located on the +z side with respect to the IC chip 360. The enclosure 350 is bonded to the base substrate 300 in such a way as to enclose the IC chip 360. The material of the enclosure 350 contains an epoxy resin, etc. The enclosure 350 has a function of protecting the IC chip 360.

1.3.3 Arrangement of Terminals on Terminal Mount Surface

In the semiconductor integrated circuit device 200 having the configuration described above, there is a risk that signals flowing through the plurality of terminals 310 might interfere with one another because the terminals 310 are arranged with high density. In particular, as is the case with the present embodiment, when the terminals 310 constitute a BGA, the terminals 310 are bare and exposed with respect to one another and, therefore, adverse effects caused by mutual interference of signals are significant; moreover, because of such high-density arrangement of the plurality of terminals 310, it is difficult to provide circuit elements, etc. for reduction of mutual interference on the printed circuit board 100 and/or the base substrate 300. For this reason, in the semiconductor integrated circuit device 200 having such a BGA structure, it is required to adopt an optimum layout for signals flowing through the plurality of terminals 310 respectively, thereby reducing the risk of mutual interference of the signals flowing through the plurality of terminals 310 respectively.

More particularly, due to recent rapid advancement of USB (Universal Serial Bus) communication technology and improvement in communication speed, in the semiconductor integrated circuit device 200 capable of performing USB communication as in the present embodiment, for the purpose of enhancing the quality of the USB communication, it is required to reduce the risk of contamination of signals inputted into the USB signal communication controller 220 configured to perform various kinds of processing needed for the USB communication with noise such as electrical crosstalk, etc.

Moreover, in the semiconductor integrated circuit device 200 into which signals conforming to a plurality of USB communications for the image information signals IMG1 and IMG2 could be inputted via the USB connection terminals 21 and 22 as in the present embodiment, there is a need to reduce the risk of influence by noise on the image information signal IMG1 inputted via the USB connection terminal 21 and the image information signal IMG2 inputted via the USB connection terminal 22 respectively. If dedicated shielding for reducing the risk of influence by noise is provided for these signals, the number of the plurality of terminals 310 constituting the BGA of the semiconductor integrated circuit device 200 will inevitably increase, resulting in the possibility of making a reduction in the size of the semiconductor integrated circuit device 200 difficult.

In order to address such technical issues concerning the semiconductor integrated circuit device 200 electrically coupled to the printing apparatus 1 via the BGA and having a function for performing a plurality of USB communications, the printing apparatus 1 including the semiconductor integrated circuit device 200 according to the present embodiment has the following configuration. The printing apparatus 1 includes: the base substrate 300, on which the IC chip 360 with the USB signal communication controller 220 mounted therein is provided; the printed circuit board 100, on which the wiring 221 electrically coupled to the USB connection terminal 21, the wiring 222 electrically coupled to the USB connection terminal 22, and the source clock circuit 270 configured to output the source clock signal XT-in are provided; and the plurality of terminals 310 constituting the BGA via which the printed circuit board 100 is electrically coupled to the base substrate 300, on which the IC chip 360 with the USB signal communication controller 220 mounted therein is provided. The plurality of terminals 310 constituting the BGA includes: the terminal 310 for electric coupling between the USB signal communication controller 220 and the USB connection terminal 21; the terminal 310 for electric coupling between the USB signal communication controller 220 and the USB connection terminal 22; and the terminal 310 for electric coupling between the source clock circuit 270 and the USB signal communication controller 220 and for flow of the source clock signal XT-in serving as a source original from which a clock signal indicating the operation timing of the USB signal communication controller 220 is produced. Among the plurality of terminals 310 constituting the BGA, the terminal 310 through which the source clock signal XT-in flows is located between the terminal 310 for electric coupling between the USB signal communication controller 220 and the USB connection terminal 21 and the terminal 310 for electric coupling between the USB signal communication controller 220 and the USB connection terminal 22. The semiconductor integrated circuit device 200 and the USB signal communication controller 220 operate at a timing specified by a signal obtained by performing frequency division or frequency multiplication of the source clock signal XT-in.

In the semiconductor integrated circuit device 200 having the configuration described above, the USB signal communication controller 220 included in the semiconductor integrated circuit device 200 operates at a timing that is based on the source clock signal XT-in. Therefore, the image information signal IMG1 inputted into the USB signal communication controller 220 via the USB connection terminal 21 and the image information signal IMG2 inputted into the USB signal communication controller 220 via the USB connection terminal 22 also flow at a timing that is based on the source clock signal XT-in. The terminal 310 through which the source clock signal XT-in flows is located between the terminals 310 through which the image information signal IMG1 flows as a signal flowing at a timing that is based on the source clock signal XT-in and the terminals 310 through which the image information signal IMG2 flows as a signal flowing at a timing that is based on the source clock signal XT-in. This terminal layout reduces the risk of contamination of the source clock signal XT-in with a signal of a different operation timing behaving as noise. The reduced risk of contamination of the source clock signal XT-in with noise improves the precision of the image information signals IMG1 and IMG2 flowing at a timing that is based on the source clock signal XT-in, too. Moreover, since the source clock signal XT-in is shielded by the terminals 310 through which the image information signal IMG1 flows and the terminals 310 through which the image information signal IMG2 flows, it is unnecessary to provide any dedicated shield terminal for reduction of noise on the source clock signal XT-in. This decreases the possibility of having difficulty in reducing the size of the semiconductor integrated circuit device 200.

A specific example of the arrangement of the terminals 310 through which the source clock signal XT-in and the image information signals IMG1 and IMG2 flow respectively, among the plurality of terminals 310 provided on the terminal mount surface 301 of the semiconductor integrated circuit device 200 having the configuration described above, will now be explained. Before giving an explanation of a specific example of the arrangement of the terminals 310 through which the source clock signal XT-in and the image information signals IMG1 and IMG2 flow respectively, the arrangement of the plurality of terminals 310 provided on the terminal mount surface 301 will be explained first.

Figure 8:
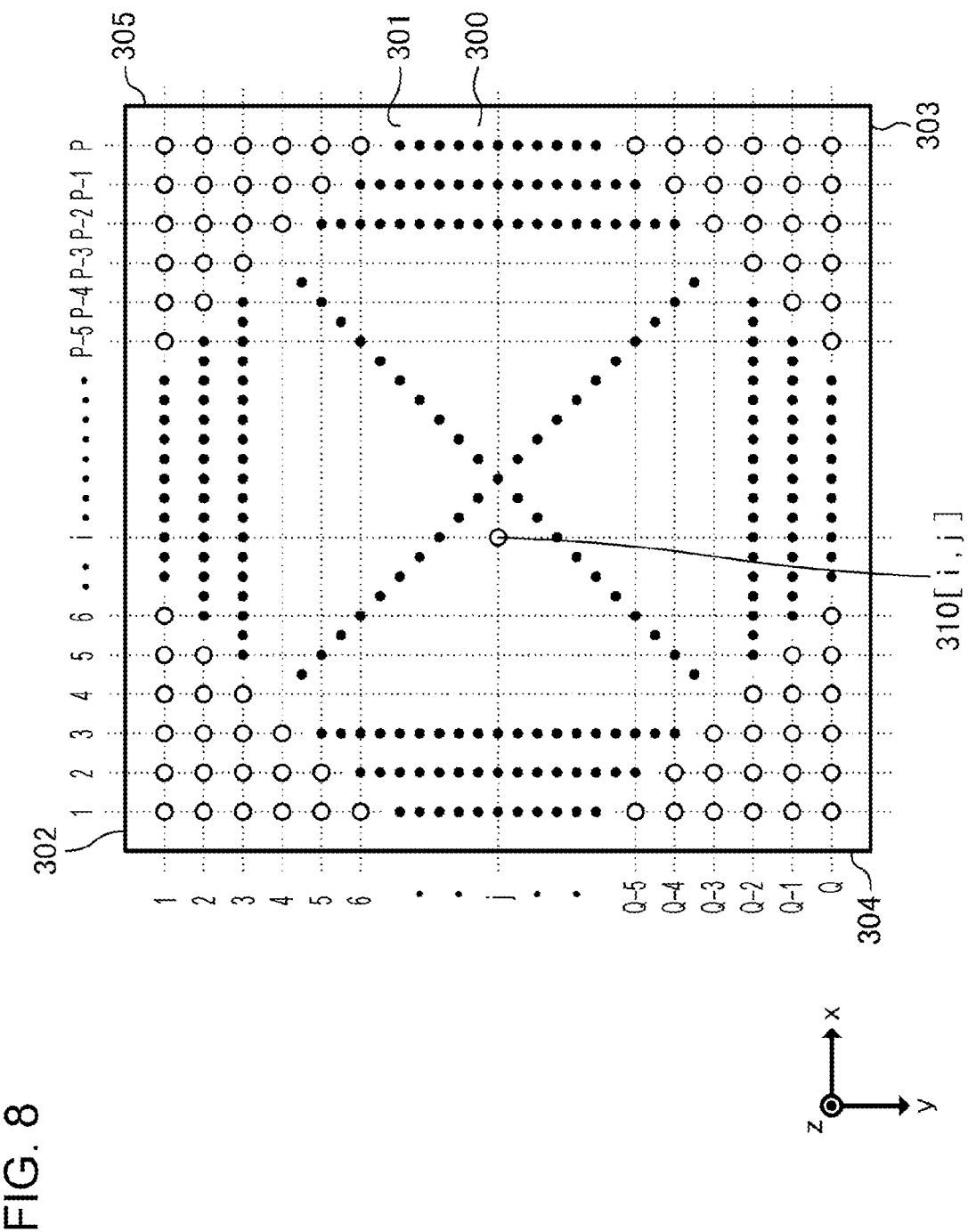
FIG. 8 is a diagram that illustrates an example of the arrangement of a plurality of terminals provided on a terminal mount surface.

FIG. 8 is a diagram that illustrates an example of the arrangement of the plurality of terminals 310 provided on the terminal mount surface 301. As illustrated in FIG. 8, the terminal mount surface 301 has sides 302 and 303 that extend in the x direction and are the opposite of each other in the y direction and sides 304 and 305 that extend in the y direction and are the opposite of each other in the x direction. The side 304 intersects with both the side 302 and the side 303. The side 305 intersects with both the side 302 and the side 303. That is, the base substrate 300 has a substantially rectangular shape whose contour is defined by the sides 302 to 305.

As illustrated in FIG. 8, plural terminals 310 the number of which is P are arranged next to one another linearly in the x direction to make up a row, and plural rows the number of which is Q, each made up of the P-number of terminals 310 arranged next to one another, are arranged in the y direction on the terminal mount surface 301. That is, the terminals 310 are arranged in a matrix of P×Q in total on the terminal mount surface 301. In the description below, among the terminals 310 arranged in the matrix of P×Q on the terminal mount surface 301, the terminal 310 located on the i-th position counted from the side 304 in the x direction and on the j-th position counted from the side 302 in the y direction may be hereinafter referred to as "terminal 310 [i, j]" (where i-th denotes an ordinal number that is any one of 1 to P, and j-th denotes an ordinal number that is any one of 1 to Q).

Figure 9:
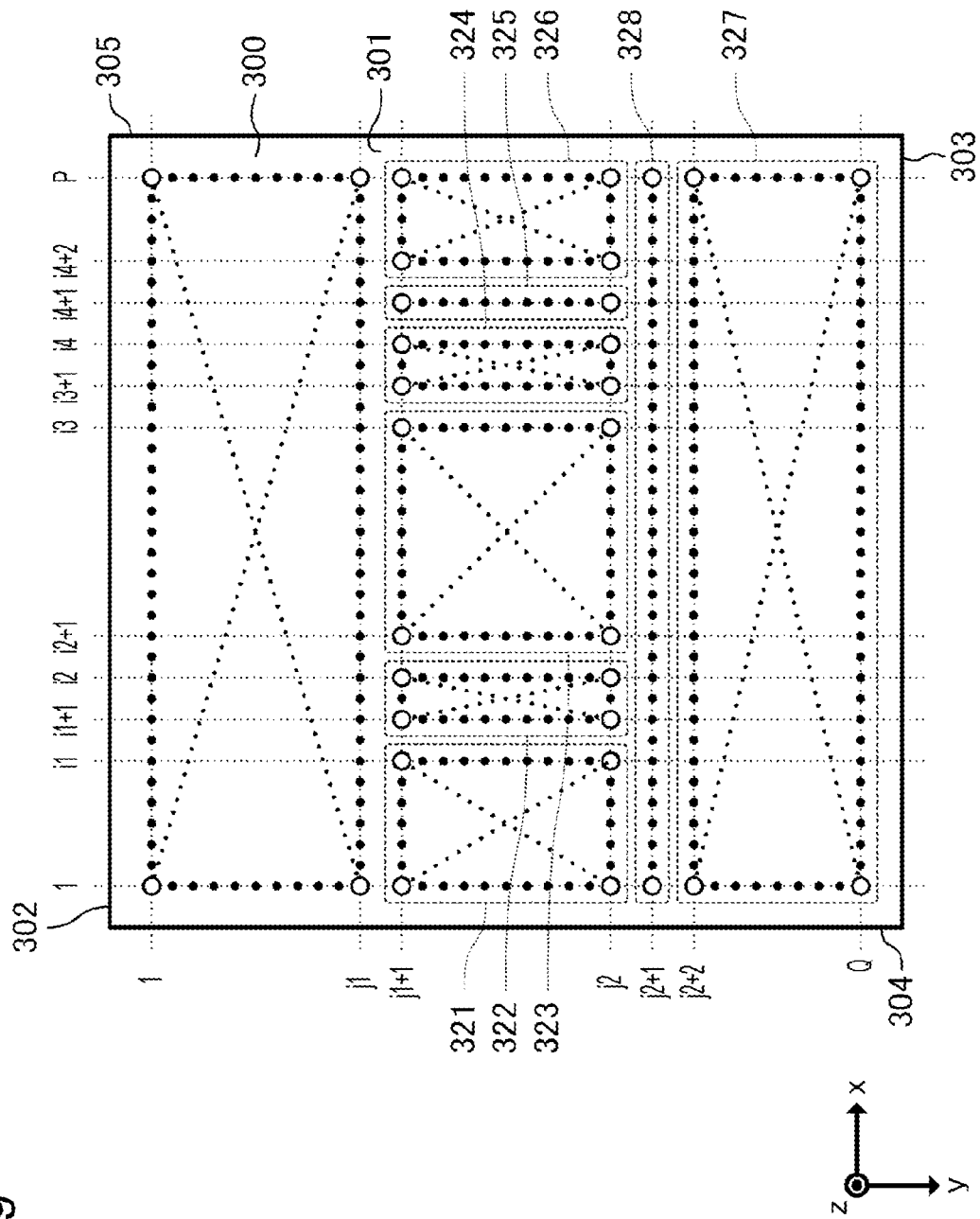
FIG. 9 is a diagram for explaining a relationship between the plurality of terminals provided on the terminal mount surface and various circuits provided in an IC chip.

FIG. 9 is a diagram for explaining a relationship between the plurality of terminals 310 provided on the terminal mount surface 301 and various circuits provided in the IC chip 360. As illustrated in FIG. 9, terminal areas 321 to 328 including the plurality of terminals 310 are located on the terminal mount surface 301. In FIG. 9, i1 to i4 denote positions satisfying a relation of $1 \leq i1 < i2 < i3 < i4 < P$ along the x direction, and j1 to j2 denote positions satisfying a relation of $1 \leq j1 < j2 < Q$ along the y direction.

The terminal area 321 includes a plurality of terminals 310 located in a region whose corners are defined by the terminal 310 [1, j1+1], the terminal 310 [i1, j1+1], the terminal 310 [1, j2], and the terminal 310 [i1, j2]. The plurality of terminals 310 included in the terminal area 321 is electrically coupled to the USB signal communication controller 220. The image information signals IMG1 and IMG2 flow through the plurality of terminals 310 included in the terminal area 321.

The terminal area 322 includes a plurality of terminals 310 located in a region whose corners are defined by the terminal 310 [i1+1, j1+1], the terminal 310 [i2, j1+1], the terminal 310 [i1+1, j2], and the terminal 310 [i2, j2]. The plurality of terminals 310 included in the terminal area 322 is electrically coupled to the control signal communication controller 240. A signal corresponding to the ejection control signal DATA of the print control signal PCS flows through the plurality of terminals 310 included in the terminal area 322.

The terminal area 323 includes a plurality of terminals 310 located in a region whose corners are defined by the terminal 310 [i2+1, j1+1], the terminal 310 [i3, j1+1], the terminal 310 [i2+1, j2], and the terminal 310 [i3, j2]. The voltages VDD and VSS functioning as power supply for the semiconductor integrated circuit device 200 flow through the plurality of terminals 310 included in the terminal area 323.

The terminal area 324 includes a plurality of terminals 310 located in a region whose corners are defined by the terminal 310 [i3+1, j1+1], the terminal 310 [i4, j1+1], the terminal 310 [i3+1, j2], and the terminal 310 [i4, j2]. The plurality of terminals 310 included in the terminal area 324 is electrically coupled to the control signal communication controller 240. A signal corresponding to the display control signal SH of the print control signal PCS for controlling indication lamps such as LEDs indicating the status of power activation of the semiconductor integrated circuit device 200 and the status of transmission of various kinds of data flows through the plurality of terminals 310 included in the terminal area 324.

The terminal area 326 includes a plurality of terminals 310 located in a region whose corners are defined by the terminal 310 [i4+2, j1+1], the terminal 310 [P, j1+1], the terminal 310 [i4+2, j2], and the terminal 310 [P, j2]. The plurality of terminals 310 included in the terminal area 326 is electrically coupled to the control signal communication controller 240. A signal corresponding to the transportation control signal SK of the print control signal PCS for controlling the operation of the transportation unit 60 flows through the plurality of terminals 310 included in the terminal area 326.

The terminal area 327 includes a plurality of terminals 310 located in a region whose corners are defined by the terminal 310 [1, j2+2], the terminal 310 [P, j2+2], the terminal 310 [1, Q], and the terminal 310 [P, Q]. The plurality of terminals 310 included in the terminal area 327 is electrically coupled to the memory controller 230. The memory control signal MCS flows through the plurality of terminals 310 included in the terminal area 327.

The terminal area 325 includes a plurality of terminals 310 located in a region whose ends are defined by the terminal 310 [i4+1, j1+1] and the terminal 310 [i4+1, j2]. The terminal area 328 includes a plurality of terminals 310 located in a region whose ends are defined by the terminal 310 [1, j2+1] and the terminal 310 [P, j2+1]. The voltage VSS serving as the reference potential of the semiconductor integrated circuit device 200 flows through the plurality of terminals 310 included in the terminal area 325, 328. The terminal area 325, 328 functions as a shield for reducing the risk of mutual interference of signals between terminal areas located next to each other.

The layout in the terminal area 321 that includes the plurality of terminals 310 electrically coupled to the USB signal communication controller 220, which is characteristic in the semiconductor integrated circuit device 200 according to the present embodiment, among the plurality of terminals 310 provided on the terminal mount surface 301 having the configuration described above, will now be explained in detail. In the printing apparatus 1 according to the present embodiment, the following terminals are arranged inside the terminal area 321 where the plurality of terminals 310 electrically coupled to the USB signal communication controller 220 is located: the terminal 310 through which the differential signal IMG1+, of the image information signal IMG1 that is a pair of differential signals, flows; the terminal 310 through which the differential signal IMG1– flows; the terminal 310 through which the differential signal IMG2+, of the image information signal IMG2 that is a pair of differential signals, flows; the terminal 310 through which the differential signal IMG2– flows; the terminal 310 through which the source clock signal XT-in flows, and the terminal 310 through which the source generation signal XT-out flows. In the description below, the terminal 310 through which the differential signal IMG1+ flows will be referred to as "terminal tIMG1+", the terminal 310 through which the differential signal IMG1– flows will be referred to as "terminal tIMG1–", the terminal 310 through which the differential signal IMG2+ flows will be referred to as "terminal tIMG2+", the terminal 310 through which the differential signal IMG2– flows will be referred to as "terminal tIMG2–", the terminal 310 through which the source clock signal XT-in flows will be referred to as "terminal tXT-in", and the terminal 310 through which the source generation signal XT-out flows will be referred to as "terminal tXT-out".

Figure 10:
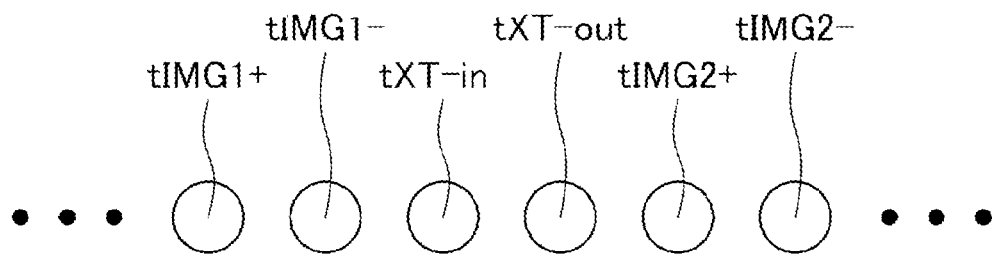
FIG. 10 is a diagram for explaining the arrangement of a plurality of terminals included in a terminal area.

FIG. 10 is a diagram for explaining the arrangement of the plurality of terminals 310 included in the terminal area 321. In FIG. 10, a case where the terminal tXT-in through which the source clock signal XT-in flows, the terminal tXT-out through which the source generation signal XT-out flows, the terminals tIMG1+ and tIMG1– through which the image information signal IMG1 flows, and the terminals tIMG2+ and tIMG2– through which the image information signal IMG2 flows are arranged in one direction is taken as an example. That is, in FIG. 10, the terminals tXT-in, txT-out, tIMG1+, tIMG1–, tIMG2+, and tIMG2– are arranged next to one another in the x direction or in the y direction on the terminal mount surface 301 illustrated in FIG. 8.

As illustrated in FIG. 10, the terminal tIMG1+, through which the differential signal IMG1+ that is one of the pair of differential signals constituting the image information signal IMG1 supplied via the USB connection terminal 21 flows between the USB signal communication controller 220 and external equipment, etc., is located next to the terminal tIMG1–, through which the differential signal IMG1– that is the other of the pair of differential signals constituting the image information signal IMG1 supplied via the USB connection terminal 21 flows between the USB signal communication controller 220 and external equipment, etc. The terminal tIMG2+, through which the differential signal IMG2+ that is one of the pair of differential signals constituting the image information signal IMG2 supplied via the USB connection terminal 22 flows, is located next to the terminal tIMG2–, through which the differential signal IMG2– that is the other of the pair of differential signals constituting the image information signal IMG2 supplied via the USB connection terminal 22 flows. The terminal tXT-in, through which the source clock signal XT-in to be supplied to the USB signal communication controller 220 flows, and the terminal tXT-out, through which the source generation signal XT-out, as a signal for causing an oscillator such as a crystal vibrator included in the source clock circuit 270 to oscillate and for generating the source clock signal XT-in, flows, are located between the terminal tIMG1+, through which the differential signal IMG1+ flows, and the terminal tIMG2–, through which the differential signal IMG2– flows.

As explained above, the terminal tXT-in, through which the source clock signal XT-in to be supplied to the USB signal communication controller 220 flows, is located between the terminal tIMG1+, through which the differential signal IMG1+ that is one of the pair of differential signals constituting the image information signal IMG1 flows as a signal flowing at a timing that is based on the source clock signal XT-in, and the terminal tIMG2–, through which the differential signal IMG2– that is the other of the pair of differential signals constituting the image information signal IMG2 flows as a signal flowing at a timing that is based on the source clock signal XT-in. Because of this arrangement, the terminal tIMG1+, through which the differential signal IMG1+ that is one of the pair of differential signals constituting the image information signal IMG1 flows as a signal flowing at a timing that is based on the source clock signal XT-in, and the terminal tIMG2–, through which the differential signal IMG2– that is the other of the pair of differential signals constituting the image information signal IMG2 flows as a signal flowing at a timing that is based on the source clock signal XT-in, function as shield terminals for protecting the terminal tXT-in, through which the source clock signal XT-in flows, from noise such as electrical crosstalk, etc.

Consequently, the risk of noise contamination of the terminal tXT-in, through which the source clock signal XT-in flows, decreases. Therefore, the precision of the source clock signal XT-in improves, and, in addition, the propagation precision of the image information signal IMG1, IMG2 flowing at a timing that is based on the source clock signal XT-in improves.

Moreover, since the terminal tIMG1+, through which the differential signal IMG1+ flows, and the terminal tIMG2–, through which the differential signal IMG2– flows, function as shield terminals for protecting the terminal tXT-in, through which the source clock signal XT-in flows, from IMG noise, it is unnecessary to provide a shield terminal for reducing the risk that noise will enter the terminal tXT-in, through which the source clock signal XT-in flows. This reduces the possibility that an increase in the number of terminals due to advancing multi-functionality of the semiconductor integrated circuit device 200 might make it difficult to reduce the size of the semiconductor integrated circuit device 200.

The meaning of a sentence "the terminal tXT-in, through which the source clock signal XT-in flows, is located between the terminal tIMG1+, through which the differential signal IMG1+ flows, and the terminal tIMG2−, through which the differential signal IMG2− flows" shall not be construed as being limited to a meaning that the terminal tXT-in is located on a virtual line connecting the terminal tIMG1+ and the terminal tIMG2−. The meaning of this sentence encompasses not only such a virtual line arrangement but also arrangement that at least a part of the terminal tXT-in is located between the terminal tIMG1+ and the terminal tIMG2− when viewed in a direction intersecting with a direction in which the terminal tIMG1+ and the terminal tIMG2− are arranged. Similarly, the meaning of a sentence "the terminal tXT-out, through which the source generation signal XT-out flows, is located between the terminal tIMG1+, through which the differential signal IMG1+ flows, and the terminal tIMG2−, through which the differential signal IMG2− flows" shall not be construed as being limited to a meaning that the terminal tXT-out is located on a virtual line connecting the terminal tIMG1+ and the terminal tIMG2−. The meaning of this sentence encompasses not only such a virtual line arrangement but also arrangement that at least a part of the terminal tXT-out is located between the terminal tIMG1+ and the terminal tIMG2− when viewed in a direction intersecting with a direction in which the terminal tIMG1+ and the terminal tIMG2− are arranged.

As illustrated in FIG. 10, the terminal tIMG1−, through which the differential signal IMG1− that is the other of the pair of differential signals constituting the image information signal IMG1 flows, is located between the terminal tIMG1+, through which the differential signal IMG1+ flows, and the terminal tXT-in, through which the source clock signal XT-in flows. The terminal tIMG2+, through which the differential signal IMG2+ that is one of the pair of differential signals constituting the image information signal IMG2 flows, is located between the terminal tIMG2−, through which the differential signal IMG2− flows, and the terminal tXT-in, through which the source clock signal XT-in flows.

Because of this arrangement, not only the terminals tIMG1+ and tIMG2− but also the terminals tIMG1− and tIMG2+ function as shield terminals. More specifically, because of this arrangement, in addition to the terminal tIMG1+, through which the differential signal IMG1+ that is one of the pair of differential signals constituting the image information signal IMG1 flows as a signal flowing at a timing that is based on the source clock signal XT-in, and in addition to the terminal tIMG2−, through which the differential signal IMG2− that is the other of the pair of differential signals constituting the image information signal IMG2 flows as a signal flowing at a timing that is based on the source clock signal XT-in, the terminal tIMG1−, through which the differential signal IMG1− that is the other of the pair of differential signals constituting the image information signal IMG1 flows as a signal flowing at a timing that is based on the source clock signal XT-in, and the terminal tIMG2+, through which the differential signal IMG2+ that is one of the pair of differential signals constituting the image information signal IMG2 flows as a signal flowing at a timing that is based on the source clock signal XT-in, function as shield terminals for protecting the terminal tXT-in, through which the source clock signal XT-in flows, from noise such as electrical crosstalk, etc. Consequently, the risk that noise will enter the terminal tXT-in, through which the source clock signal XT-in flows, further decreases, the precision of the source clock signal XT-in further improves, and, in addition, the propagation precision of the image information signal IMG1, IMG2 flowing at a timing that is based on the source clock signal XT-in further improves.

In this example, as illustrated in FIG. 10, the terminal tIMG1+, through which the differential signal IMG1+ that is one of the pair of differential signals constituting the image information signal IMG1 flows, and the terminal tIMG1−, through which the differential signal IMG1− that is the other of the pair of differential signals constituting the image information signal IMG1 flows, may preferably be located next to each other. The terminal tIMG2+, through which the differential signal IMG2+ that is one of the pair of differential signals constituting the image information signal IMG2 flows, and the terminal tIMG2−, through which the differential signal IMG2− that is the other of the pair of differential signals constituting the image information signal IMG2 flows, may preferably be located next to each other.

This arrangement makes it possible to reduce a difference between the length of a propagation path along which the differential signal IMG1+ that is one of the pair of differential signals constituting the image information signal IMG1 flows and the length of a propagation path along which the differential signal IMG1− that is the other of the pair of differential signals constituting the image information signal IMG1 flows, resulting in a further improvement in the precision of the image information signal IMG1. Similarly, this arrangement makes it possible to reduce a difference between the length of a propagation path along which the differential signal IMG2+ that is one of the pair of differential signals constituting the image information signal IMG2 flows and the length of a propagation path along which the differential signal IMG2− that is the other of the pair of differential signals constituting the image information signal IMG2 flows, resulting in a further improvement in the precision of the image information signal IMG2.

Furthermore, in the printing apparatus 1 according to the present embodiment, the terminal tXT-in, through which the source clock signal XT-in flows, and the terminal tXT-out, through which the source generation signal XT-out flows, are located between the terminal tIMG1+, through which the differential signal IMG1+ flows, and the terminal tIMG2−, through which the differential signal IMG2− flows; in addition, the terminal tIMG1−, through which the differential signal IMG1− that is the other of the pair of differential signals constituting the image information signal IMG1 flows, is located between the terminal tIMG1+, through which the differential signal IMG1+ flows, and the terminal tXT-in, through which the source clock signal XT-in flows; further in addition, the terminal tIMG2+, through which the differential signal IMG2+ that is one of the pair of differential signals constituting the image information signal IMG2 flows, is located between the terminal tIMG2−, through which the differential signal IMG2− flows, and the terminal tXT-in, through which the source clock signal XT-in flows. This arrangement reduces the risk that noise will enter wiring via which the source clock signal XT-in and the source generation signal XT-out flow inside the semiconductor integrated circuit device 200.

Figure 11:
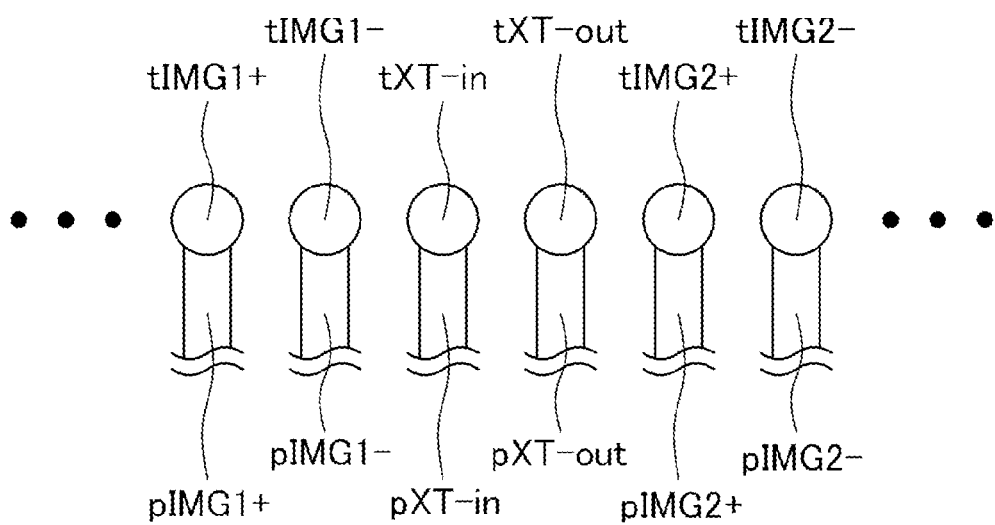
FIG. 11 is a diagram that illustrates an example of the internal wiring of the semiconductor integrated circuit device.

FIG. 11 is a diagram that illustrates an example of the internal wiring of the semiconductor integrated circuit device 200.

As illustrated in FIG. 11, the terminal tIMG1+ is electrically coupled to the wiring pattern pIMG1+ inside the semiconductor integrated circuit device 200, and the differential signal IMG1+ flows through the terminal tIMG1+. The terminal tIMG1− is electrically coupled to the wiring pattern pIMG1− inside the semiconductor integrated circuit device 200, and the differential signal IMG1− flows through the terminal tIMG1−. The terminal tIMG2+ is electrically coupled to the wiring pattern pIMG2+ inside the semiconductor integrated circuit device 200, and the differential signal IMG2+ flows through the terminal tIMG2+. The terminal tIMG2− is electrically coupled to the wiring pattern pIMG2− inside the semiconductor integrated circuit device 200, and the differential signal IMG2− flows through the terminal tIMG2−. The terminal tXT-in is electrically coupled to the wiring pattern pXT-in inside the semiconductor integrated circuit device 200. In this layout, the terminal tXT-in is located between a pair made up of the terminals tIMG1+ and tIMG1− and a pair made up of the terminals tIMG2+ and tIMG2−. Therefore, the wiring pattern pXT-in is located between a pair made up of the wiring patterns pIMG1+ and pIMG1− and a pair made up of the wiring patterns pIMG2+ and pIMG2−. Therefore, the illustrated arrangement reduces the risk that electrical crosstalk will occur on the wiring pattern pXT-in, which is electrically coupled to the terminal tXT-in, and through which the source clock signal XT-in flows inside the semiconductor integrated circuit device 200.

That is, in the semiconductor integrated circuit device 200 used in the printing apparatus 1 according to the present embodiment, since the terminal tXT-in is located between a pair made up of the terminals tIMG1+ and tIMG1− and a pair made up of the terminals tIMG2+ and tIMG2−, the influence of electrical crosstalk inside the semiconductor integrated circuit device 200 is also reduced.

Among the plurality of terminals 310 constituting the BGA, one of the terminals tIMG1+ and tIMG1− through which a pair of differential signals constituting the image information signal IMG1 flow, more specifically, the terminal tIMG1+, through which the differential signal IMG1+ flows, is an example of a first ball grid, and the other, more specifically, the terminal tIMG1−, through which the differential signal IMG1− flows, is an example of a fourth ball grid. One of the terminals tIMG2+ and tIMG2− through which a pair of differential signals constituting the image information signal IMG2 flow, more specifically, the terminal tIMG2+, through which the differential signal IMG2+ flows, is an example of a fifth ball grid, and the other, more specifically, the terminal tIMG2−, through which the differential signal IMG2− flows, is an example of a second ball grid. The terminal tXT-in, through which the source clock signal XT-in flows as an example of a source clock, is an example of a third ball grid. The terminal tXT-out, through which the source generation signal XT-out for generating the source clock signal XT-in flows, is an example of a sixth ball grid. The image information signal IMG1 is an example of a pair of first differential signals. The image information signal IMG2 is an example of a pair of second differential signals.

1.4 Operational Effects

In the semiconductor integrated circuit device 200 used in an electronic apparatus such as the printing apparatus 1 according to the first embodiment having the configuration described above, the terminal 310 through which the source clock signal XT-in flows is located between a pair made up of the terminals tIMG1+ and tIMG1−, through which the image information signal IMG1 flows as a signal flowing at a timing that is based on the source clock signal XT-in, and a pair made up of the terminals tIMG2+ and tIMG2−, through which the image information signal IMG2 flows as a signal flowing at a timing that is based on the source clock signal XT-in. This terminal layout reduces the risk that a signal of a different operation timing behaving as noise will enter the terminal tXT-in, through which the source clock signal XT-in flows. Reducing the risk of entry of noise into the terminal tXT-in reduces the risk of contamination of the source clock signal XT-in flowing through the terminal tXT-in with the noise. As a result, the precision of the image information signal IMG1, IMG2 inputted or outputted to the USB signal communication controller 220 and flowing at a timing that is based on the source clock signal XT-in also improves.

Moreover, since the source clock signal XT-in is shielded by the terminals tIMG1+ and tIMG1−, through which the image information signal IMG1 flows, and the terminals tIMG2+ and tIMG2−, through which the image information signal IMG2 flows, it is unnecessary to provide any dedicated shield terminal for reduction of noise on the source clock signal XT-in. Therefore, the possibility of having difficulty in reducing the size of the semiconductor integrated circuit device 200 also decreases. That is, the semiconductor integrated circuit device 200 according to the present embodiment makes it possible to improve the signal precision of USB communication performed by the USB signal communication controller 220, without making a reduction in the size of the semiconductor integrated circuit device 200 difficult.

2. Second Embodiment

The semiconductor integrated circuit device 200 used in the printing apparatus 1 according to a second embodiment is different from the semiconductor integrated circuit device 200 according to the first embodiment in that, for the terminals tIMG1+ and tIMG1−, through which a pair of differential signals constituting the image information signal IMG1 flow, for the terminals tIMG2+ and tIMG2−, through which a pair of differential signals constituting the image information signal IMG2 flow, for the terminal tXT-in, through which the source clock signal XT-in flows, and for the terminal tXT-out, through which the source generation signal XT-out flows, terminals tVSS1 to tVSS10 are provided as shield terminals for reducing the risk of mutual interference of these signals flowing therethrough, wherein the terminals tVSS1 to tVSS10 are terminals 310 through which the voltage VSS indicating the reference potential of the semiconductor integrated circuit device 200 including the USB signal communication controller 220 flows. The same reference numerals are assigned to the same components as those of the printing apparatus 1 according to the first embodiment. An explanation of them is simplified or omitted.

Figure 12:
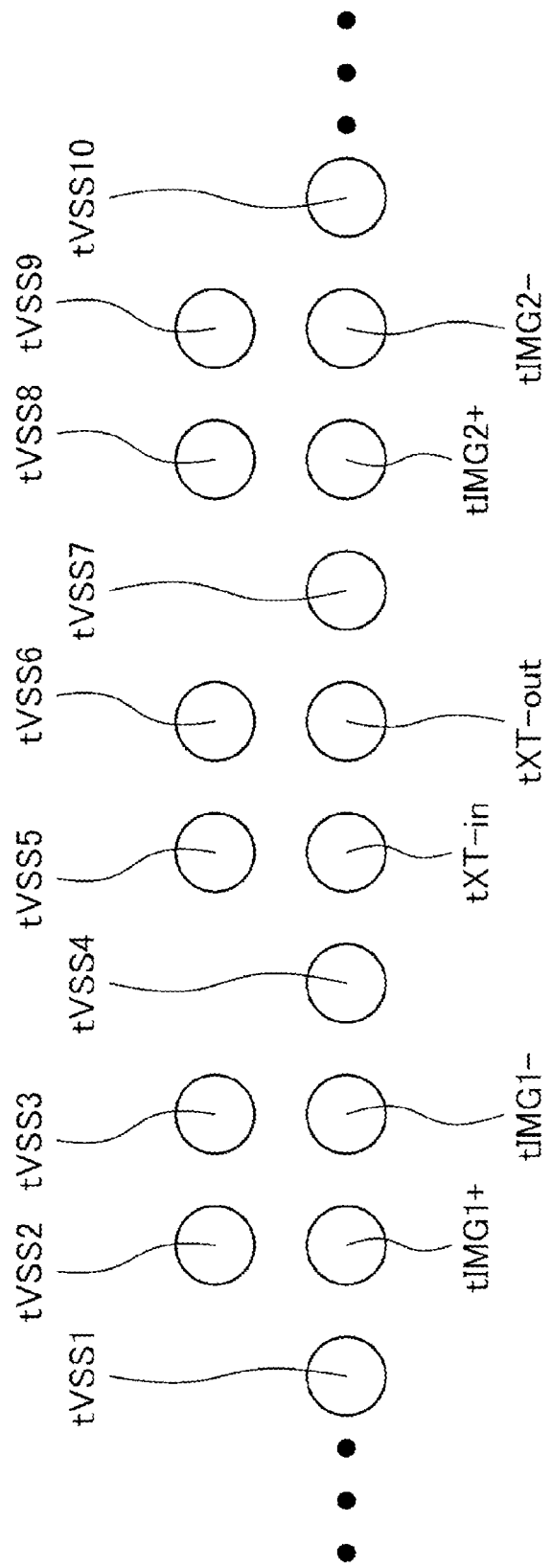
FIG. 12 is a diagram for explaining the arrangement of a plurality of terminals included in a terminal area according to a second embodiment.

FIG. 12 is a diagram for explaining the arrangement of the plurality of terminals 310 included in the terminal area 321 according to the second embodiment.

As illustrated in FIG. 12, in the semiconductor integrated circuit device 200 according to the second embodiment, the terminal tIMG1+, through which the differential signal IMG1+ that is one of the pair of differential signals constituting the image information signal IMG1 supplied via the USB connection terminal 21 flows between the USB signal communication controller 220 and external equipment, etc., is located next to the terminal tIMG1−, through which the differential signal IMG1− that is the other of the pair of differential signals constituting the image information signal IMG1 supplied via the USB connection terminal 21 flows between the USB signal communication controller 220 and the external equipment, etc. The terminal tIMG2+, through which the differential signal IMG2+ that is one of the pair of differential signals constituting the image information signal IMG2 supplied via the USB connection terminal 22 flows between the USB signal communication controller 220 and the external equipment, etc., is located next to the terminal tIMG2−, through which the differential signal IMG2− that is the other of the pair of differential signals constituting the image information signal IMG2 supplied via the USB connection terminal 22 flows between the USB signal communication controller 220 and the external equipment, etc. Moreover, the terminal tXT-in, through which the source clock signal XT-in to be supplied to the USB signal communication controller 220 flows, is located next to the terminal tXT-out, through which the source generation signal XT-out for generating the source clock signal XT-in flows. That is, the terminal tXT-in and the terminal tXT-out are located between the terminals tIMG1+ and tIMG2−, the terminal tIMG1− is located between the terminal tIMG1+ and the terminal tXT-in, and the terminal tIMG2+ is located between the terminal tIMG2− and the terminal tXT-in.

The terminal tVSS4, through which the voltage VSS indicating the reference potential of the semiconductor integrated circuit device 200 flows, is located between a pair made up of the terminal tIMG1+, through which the differential signal IMG1+ flows, and the terminal tIMG1−, through which the differential signal IMG1− flows, and a pair made up of the terminal tXT-in, through which the source clock signal XT-in flows, and the terminal tXT-out, through which the source generation signal XT-out flows. The terminal tVSS7, through which the voltage VSS indicating the reference potential of the semiconductor integrated circuit device 200 flows, is located between a pair made up of the terminal tIMG2+, through which the differential signal IMG2+ flows, and the terminal tIMG2−, through which the differential signal IMG2− flows, and the pair made up of the terminal tXT-in, through which the source clock signal XT-in flows, and the terminal tXT-out, through which the source generation signal XT-out flows.

This arrangement further reduces the risk of interference of the image information signal IMG1 that is a pair of differential signals flowing through the terminals tIMG1+ and tIMG1− with the source clock signal XT-in flowing through the terminal tXT-in and the source generation signal XT-out flowing through the terminal tXT-out. In addition, this arrangement further reduces the risk of interference of the image information signal IMG2 that is a pair of differential signals flowing through the terminals tIMG2+ and tIMG2− with the source clock signal XT-in flowing through the terminal tXT-in and the source generation signal XT-out flowing through the terminal tXT-out. Therefore, in the semiconductor integrated circuit device 200 of the printing apparatus 1 according to the second embodiment, it is possible to further increase the precision of the source clock signal XT-in and the precision of the image information signal IMG1, IMG2.

As illustrated in FIG. 12, the terminal tvSS1, through which the voltage VSS indicating the reference potential of the semiconductor integrated circuit device 200 flows, is located next to the pair made up of the terminal tIMG1+, through which the differential signal IMG1+ flows, and the terminal tIMG1−, through which the differential signal IMG1− flows, on the opposite side thereof in relation to the terminal tXT-in, and the terminal tVSS10, through which the voltage VSS indicating the reference potential of the semiconductor integrated circuit device 200 flows, is located next to the pair made up of the terminal tIMG2+, through which the differential signal IMG2+ flows, and the terminal tIMG2−, through which the differential signal IMG2− flows, on the opposite side thereof in relation to the terminal tXT-in.

This arrangement reduces the risk of mutual interference of the image information signal IMG1, IMG2 generated at a timing that is based on the source clock signal XT-in with various signals inputted into the semiconductor integrated circuit device 200. Therefore, in the semiconductor integrated circuit device 200 of the printing apparatus 1 according to the second embodiment, it is possible to further increase the precision of the image information signal IMG1, IMG2.

Moreover, the terminal tIMG1+ and the terminal tVSS2, through which the voltage VSS indicating the reference potential of the semiconductor integrated circuit device 200 flows, are located in such a way as to overlap with each other when projected in a direction intersecting with a direction in which the terminal tIMG1+ and the terminal tIMG2− are arranged, and the terminal tIMG1− and the terminal tVSS3, through which the voltage VSS indicating the reference potential of the semiconductor integrated circuit device 200 flows, are located in such a way as to overlap with each other when projected in this direction. That is, the terminals tVSS1 to tVSS4, through which the voltage VSS flows, are located in such a way as to surround the terminals tIMG1+ and tIMG1−. This arrangement further reduces the risk of mutual interference of various signals with the image information signal IMG1, thereby making it possible to further increase the precision of the image information signal IMG1.

Similarly, the terminal tXT-in and the terminal tVSS5, through which the voltage VSS indicating the reference potential of the semiconductor integrated circuit device 200 flows, are located in such a way as to overlap with each other when projected in the direction intersecting with the direction in which the terminal tIMG1+ and the terminal tIMG2− are arranged, and the terminal tXT-out and the terminal tVSS6, through which the voltage VSS indicating the reference potential of the semiconductor integrated circuit device 200 flows, are located in such a way as to overlap with each other when projected in this direction. That is, the terminals tVSS4 to tVSS7, through which the voltage VSS flows, are located in such a way as to surround the terminal tXT-in and the terminal tXT-out. This arrangement further reduces the risk of mutual interference of various signals with the source clock signal XT-in and the source generation signal XT-out, thereby making it possible to further increase the precision of the source clock signal XT-in.

Similarly, the terminal tIMG2+ and the terminal tVSS8, through which the voltage VSS indicating the reference potential of the semiconductor integrated circuit device 200 flows, are located in such a way as to overlap with each other when projected in the direction intersecting with the direction in which the terminal tIMG1+ and the terminal tIMG2− are arranged, and the terminal tIMG2− and the terminal tVSS9, through which the voltage VSS indicating the reference potential of the semiconductor integrated circuit device 200 flows, are located in such a way as to overlap with each other when projected in this direction. That is, the terminals tVSS7 to tVSS10, through which the voltage VSS flows, are located in such a way as to surround the terminals tIMG2+ and tIMG2−. This arrangement further reduces the risk of mutual interference of various signals with the image information signal IMG2, thereby making it possible to further increase the precision of the image information signal IMG2.

Figure 13:
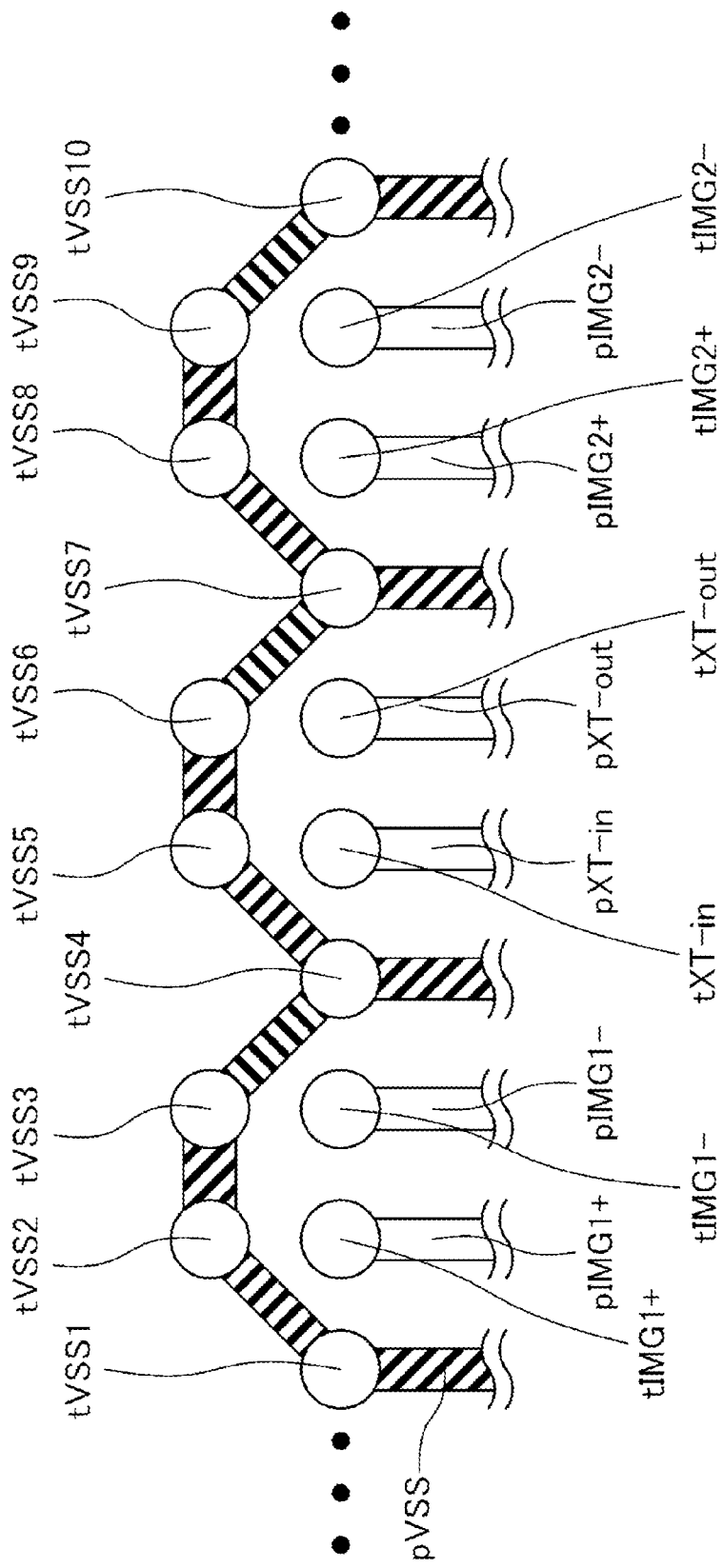
FIG. 13 is a diagram that illustrates an example of the internal wiring of a semiconductor integrated circuit device according to the second embodiment.

FIG. 13 is a diagram that illustrates an example of the internal wiring of the semiconductor integrated circuit device 200 according to the second embodiment. As illustrated in FIG. 13, in the semiconductor integrated circuit device 200 according to the second embodiment, the terminals tVSS1 to tVSS10 are interconnected via a common wiring pattern pVSS. The terminal tIMG1+ is electrically coupled to the wiring pattern pIMG1+ inside the semiconductor integrated circuit device 200, and the differential signal IMG1+ flows through the terminal tIMG1+. The terminal tIMG1− is electrically coupled to the wiring pattern pIMG1− inside the semiconductor integrated circuit device 200, and the differential signal IMG1− flows through the terminal tIMG1−. The terminal tIMG2+ is electrically coupled to the wiring pattern pIMG2+ inside the semiconductor integrated circuit device 200, and the differential signal IMG2+ flows through the terminal tIMG2+. The terminal tIMG2− is electrically coupled to the wiring pattern pIMG2− inside the semiconductor integrated circuit device 200, and the differential signal IMG2− flows through the terminal tIMG2−. The terminal tXT-in is electrically coupled to the wiring pattern pXT-in inside the semiconductor integrated circuit device 200.

In this layout, the wiring pattern pVSS, through which the voltage VSS flows, is located around the wiring patterns pIMG1+ and pIMG1− inside the semiconductor integrated circuit device 200 because the terminals tIMG1+ and tIMG1− are surrounded by the terminals tVSS1 to tVSS4, through which the voltage VSS flows; in addition, the wiring pattern pVSS, through which the voltage VSS flows, is located also around the wiring patterns pXT-in and pXT-out inside the semiconductor integrated circuit device 200 because the terminals tXT-in and tXT-out are surrounded by the terminals tVSS4 to tVSS7, through which the voltage VSS flows; in addition, the wiring pattern pVSS, through which the voltage VSS flows, is located also around the wiring patterns pIMG2+ and pIMG2− inside the semiconductor integrated circuit device 200 because the terminals tIMG2+ and tIMG2− are surrounded by the terminals tVSS7 to tVSS10, through which the voltage VSS flows.

Consequently, in the semiconductor integrated circuit device 200 used in the printing apparatus 1 according to the second embodiment, the risk of occurrence of electrical crosstalk between the internal wiring patterns of the semiconductor integrated circuit device 200 is also reduced.

As explained above, in the semiconductor integrated circuit device 200 according to the second embodiment, and in the printing apparatus 1, it is possible to further reduce the risk of contamination of the source clock signal XT-in and the image information signal IMG1, IMG2 with noise.

The terminal tVSS4 is an example of a seventh ball grid. The terminal tVSS7 is an example of an eighth ball grid. The terminal tVSS1 is an example of a ninth ball grid. The terminal tVSS10 is an example of a tenth ball grid.

3. Third Embodiment

Next, the semiconductor integrated circuit device 200 used in the printing apparatus 1 according to a third embodiment will now be explained. The explanation below will be given while referring to FIGS. 14, 15, and 16. The same reference numerals are assigned to the same components as those of the printing apparatus 1 according to the first and second embodiments. An explanation of them is simplified or omitted.

In the semiconductor integrated circuit device 200 used in the printing apparatus 1 according to the first embodiment described earlier, plural terminals 310 the number of which is P are arranged next to one another linearly in the x direction to make up a row, and plural rows the number of which is Q, each made up of the P-number of terminals 310 arranged next to one another, are arranged in the y direction on the terminal mount surface 301, thereby forming a so-called grid matrix array. The semiconductor integrated circuit device 200 used in the printing apparatus 1 according to the third embodiment is different from the semiconductor integrated circuit device 200 used in the printing apparatus 1 according to the first and second embodiments in that, as illustrated in FIG. 14, the plural terminals 310 form a staggered array on the terminal mount surface 301.

Figure 14:
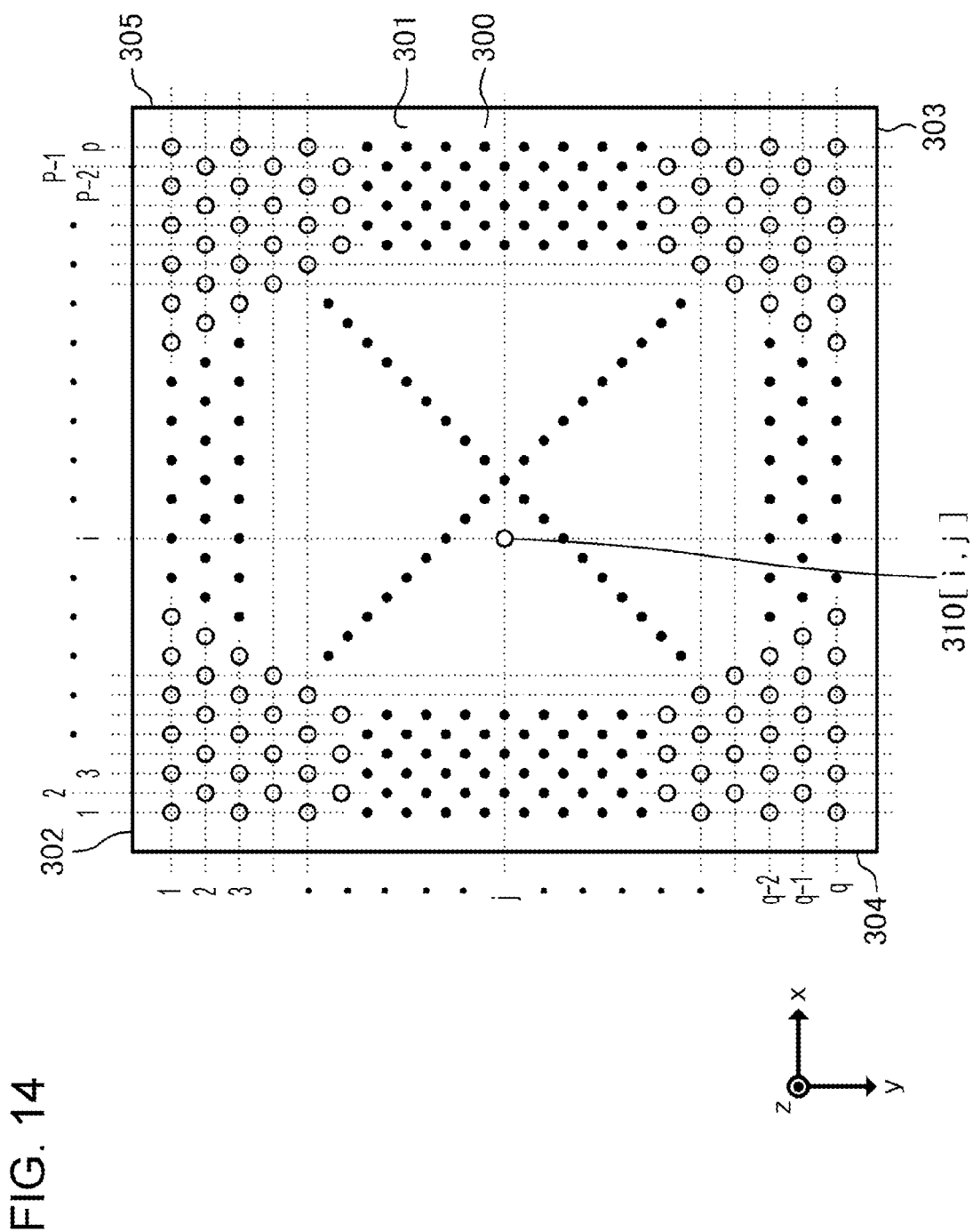
FIG. 14 is a diagram that illustrates an example of the arrangement of a plurality of terminals provided on a terminal mount surface according to a third embodiment.

FIG. 14 is a diagram that illustrates an example of the arrangement of the plurality of terminals 310 provided on the terminal mount surface 301 according to the third embodiment. As illustrated in FIG. 14, in the semiconductor integrated circuit device 200 according to the third embodiment, plural terminals 310 arranged on even rows counted in the y direction and plural terminals 310 arranged on odd rows counted in the y direction are shifted from each other in the x direction on the terminal mount surface 301.

Figure 15:
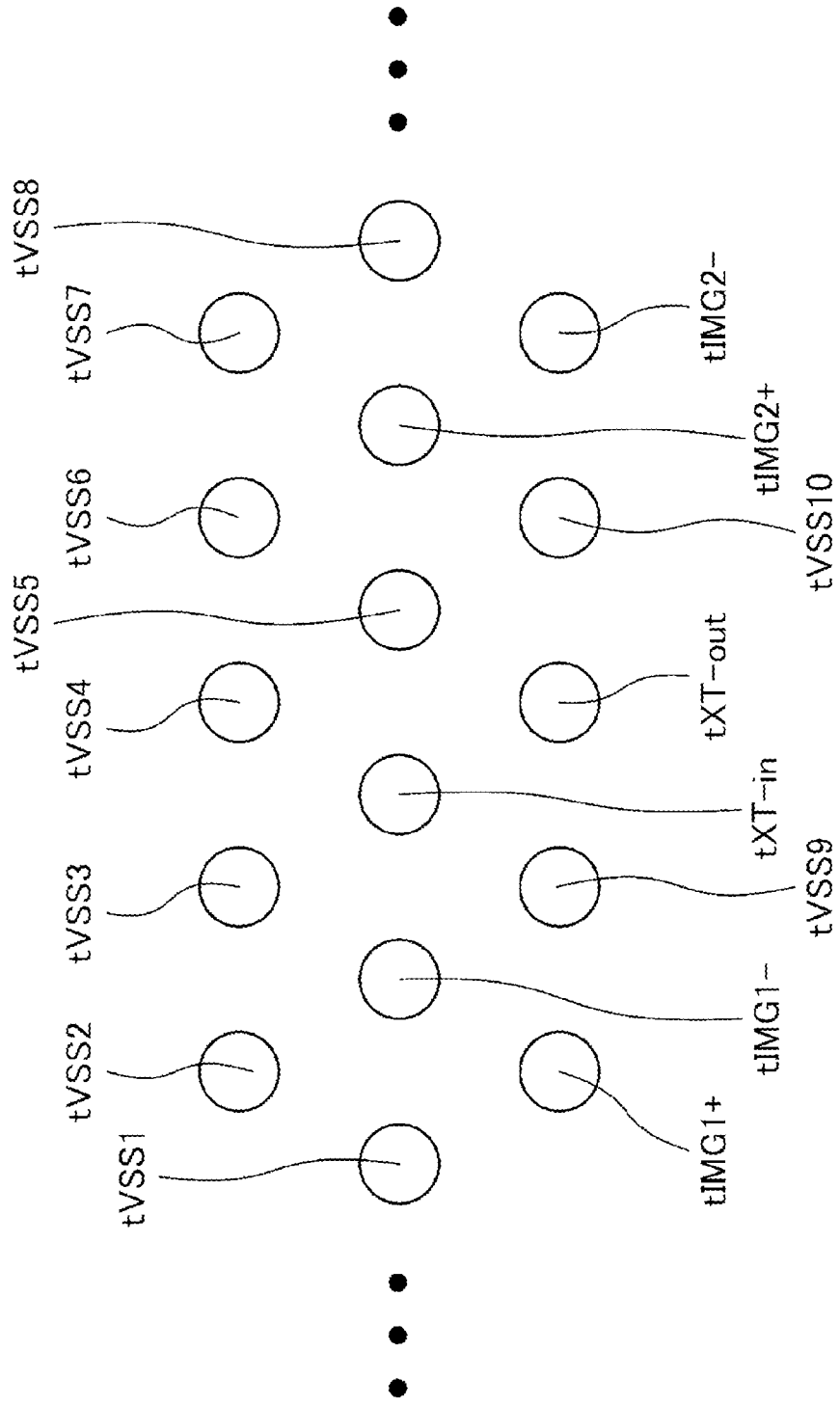
FIG. 15 is a diagram for explaining the arrangement of a plurality of terminals included in a terminal area according to the third embodiment.
Figure 16:
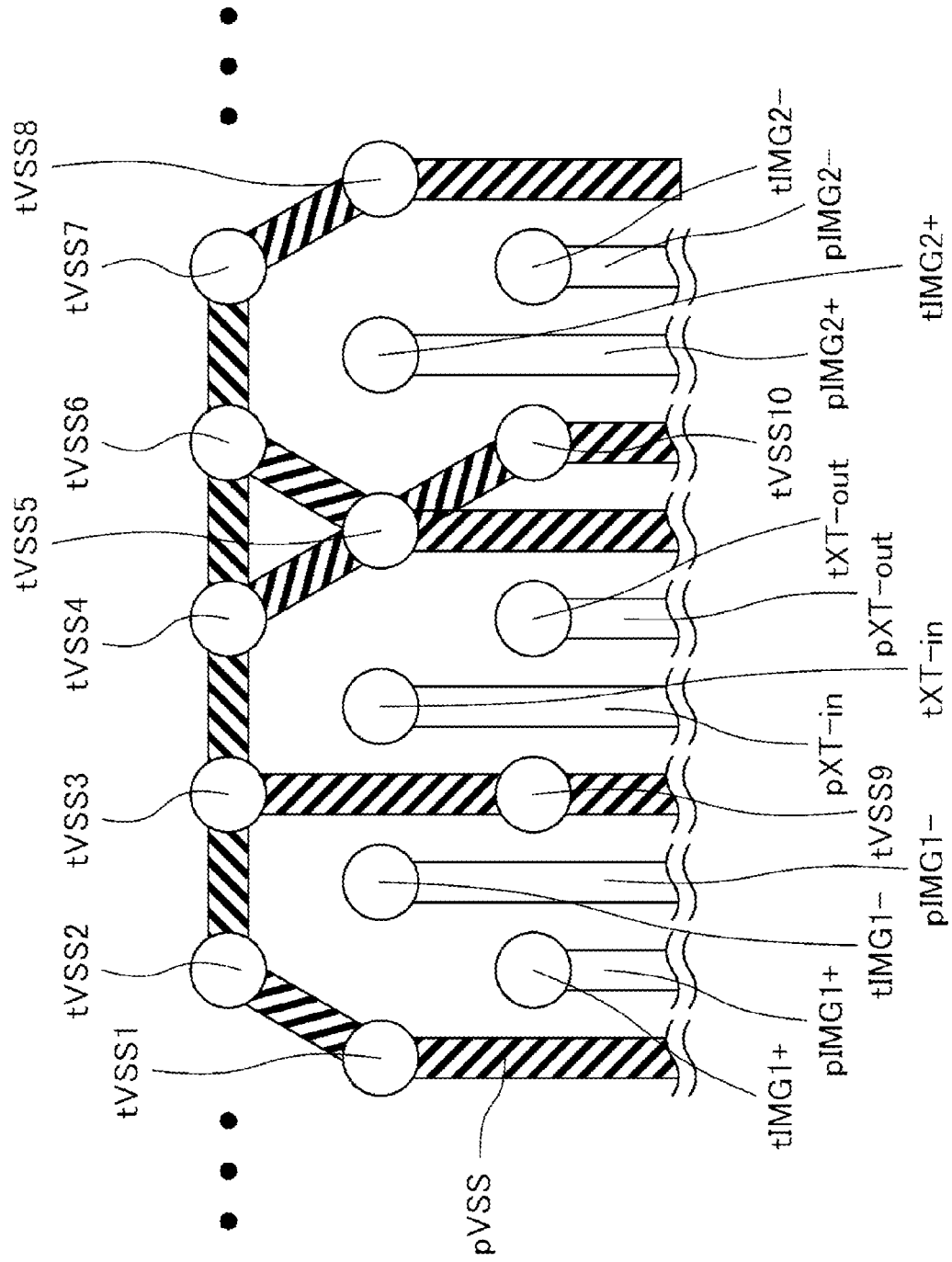
FIG. 16 is a diagram that illustrates an example of the internal wiring of a semiconductor integrated circuit device according to the third embodiment.

FIG. 15 is a diagram for explaining the arrangement of the plurality of terminals 310 included in the terminal area 321 according to the third embodiment. FIG. 16 is a diagram that illustrates an example of the internal wiring of the semiconductor integrated circuit device 200 according to the third embodiment.

As illustrated in FIG. 15, in the semiconductor integrated circuit device 200 according to the third embodiment, similarly to the semiconductor integrated circuit device 200 according to the second embodiment, but with or without a shift in a direction intersecting with a direction in which the terminal tIMG1+, through which the differential signal IMG1+ that is one of the pair of differential signals constituting the image information signal IMG1 flows, and the terminal tIMG2−, through which the differential signal IMG2− that is the other of the pair of differential signals constituting the image information signal IMG2 flows, are arranged, the terminal tXT-in, through which the source clock signal XT-in flows, and the terminal tXT-out, through which the source generation signal XT-out flows, are located between the terminals tIMG1+ and tIMG2−, and the terminal tIMG1−, through which the differential signal IMG1− that is the other of the pair of differential signals constituting the image information signal IMG1 flows, is located between the terminal tIMG1+ and the terminal tXT-in, and the terminal tIMG2+, through which the differential signal IMG2+ that is one of the pair of differential signals constituting the image information signal IMG2 flows, is located between the terminal tIMG2− and the terminal tXT-in.

The terminals tIMG1+ and tIMG1− are located next to each other. The terminals tVSS1 to tVSS3, and tVSS9, through which the voltage VSS indicating the reference potential of the semiconductor integrated circuit device 200 flows, are located around the terminals tIMG1+ and tIMG1−. The terminals tXT-in and tXT-out are located next to each other. The terminals tVSS3 to tVSS5, tVSS9, and tVSS10, through which the voltage VSS indicating the reference potential of the semiconductor integrated circuit device 200 flows, are located around the terminals tXT-in and tXT-out. The terminals tIMG2+ and tIMG2− are located next to each other. The terminals tVSS5 to tVSS8, and tVSS10, through which the voltage VSS indicating the reference potential of the semiconductor integrated circuit device 200 flows, are located around the terminals tIMG2+ and tIMG2−.

Moreover, as illustrated in FIG. 16, the wiring pattern pVSS, through which the voltage VSS flows, is located around the wiring patterns pIMG1+ and pIMG1− inside the semiconductor integrated circuit device 200 because the terminals tIMG1+ and tIMG1− are surrounded by the terminals tVSS1 to tVSS3, and tVSS9, through which the voltage VSS flows; in addition, the wiring pattern pVSS, through which the voltage VSS flows, is located also around the wiring patterns pXT-in and pXT-out inside the semiconductor integrated circuit device 200 because the terminals tXT-in and tXT-out are surrounded by the terminals tVSS3 to tVSS5, tVSS9, and tVSS10, through which the voltage VSS flows; in addition, the wiring pattern pVSS, through which the voltage VSS flows, is located also around the wiring patterns pIMG2+ and pIMG2− inside the semiconductor integrated circuit device 200 because the terminals tIMG2+ and tIMG2− are surrounded by the terminals tVSS5 to tVSS8, and tVSS10, through which the voltage VSS flows.

Therefore, the semiconductor integrated circuit device 200 used in the printing apparatus 1 according to the third embodiment produces the same or similar operational effects as those of the semiconductor integrated circuit device 200 used in the printing apparatus 1 according to the second embodiment.

Though exemplary embodiments and modification examples have been described above, the scope of the present disclosure is not limited to these embodiments, etc. The present disclosure can be implemented in various ways within a range not departing from the gist thereof. For example, the foregoing embodiments may be combined as needed.

The present disclosure encompasses every structure that is substantially the same as the structure described in the embodiments (for example, structure with the same function, method, and result, or structure with the same object and effect). The present disclosure encompasses every structure that is obtained by replacement of a non-essential part of the structure described in the embodiments. The present disclosure encompasses every structure that produces the same operational effect as that of the structure described in the embodiments, or achieves the same object as that of the structure described in the embodiments. The present disclosure encompasses every structure that is obtained by addition of known art to the structure described in the embodiments.

The following content can be derived from the foregoing embodiments and modification examples.

An electronic apparatus according to a certain aspect of the present disclosure includes: an integrated circuit board on, over, or in which a USB circuit block is provided; a first USB interface; a second USB interface; a printed circuit board on which first connection wiring electrically coupled to the first USB interface, second connection wiring electrically coupled to the second USB interface, and a source clock circuit configured to output a source clock are provided; and a ball grid array that includes a first ball grid, a second ball grid, and a third ball grid for electric coupling between the integrated circuit board and the printed circuit board; wherein the first ball grid electrically couples the USB circuit block and the first USB interface to each other via the first connection wiring, the second ball grid electrically couples the USB circuit block and the second USB interface to each other via the second connection wiring, the third ball grid electrically couples the source clock circuit and the USB circuit block to each other, and the third ball grid is located between the first ball grid and the second ball grid.

With the electronic apparatus having this configuration, it is possible to shield the third ball grid, through which the source clock supplied to the USB circuit block flows, by the first ball grid, which electrically couples the USB circuit block and the first USB interface to each other, and by the second ball grid, which electrically couples the USB circuit block and the second USB interface to each other. The shielding makes it possible to reduce the risk of contamination of the source clock supplied to the USB circuit block with noise such as electrical crosstalk. Moreover, the electronic apparatus having this configuration makes it unnecessary to provide any dedicated terminal for shielding the third ball grid, through which the source clock supplied to the USB circuit block flows, and thus reduces the possibility of an increase in the number of grid balls for connection between the printed circuit board and the integrated circuit board of the electronic apparatus. Consequently, the possibility of having difficulty in reducing the size of the semiconductor integrated circuit device equipped with the integrated circuit board and the ball grid array also decreases.

In the electronic apparatus according to the above one aspect, the ball grid array may further include a fourth ball grid and a fifth ball grid, one of a pair of first differential signals supplied via the first USB interface may flow through the first ball grid, one of a pair of second differential signals supplied via the second USB interface may flow through the second ball grid, an other of the pair of first differential signals may flow through the fourth ball grid, an other of the pair of second differential signals may flow through the fifth ball grid, the fourth ball grid may be located between the first ball grid and the third ball grid, and the fifth ball grid may be located between the second ball grid and the third ball grid.

The electronic apparatus having this configuration makes it possible to reduce a difference between the length of a propagation path along which one of the pair of first differential signals supplied via the first USB interface flows and the length of a propagation path along which the other flows, thereby improving the precision of the pair of first differential signals. In addition, the electronic apparatus having this configuration makes it possible to reduce a difference between the length of a propagation path along which one of the pair of second differential signals supplied via the second USB interface flows and the length of a propagation path along which the other flows, thereby improving the precision of the pair of second differential signals.

Furthermore, the electronic apparatus having this configuration makes it possible to shield the third ball grid, through which the source clock supplied to the USB circuit block flows, by the first ball grid, which electrically couples the USB circuit block and the first USB interface to each other, and the fourth ball grid, and by the second ball grid, which electrically couples the USB circuit block and the second USB interface to each other, and the fifth ball grid. The shielding makes it possible to reduce the risk of contamination of the source clock supplied to the USB circuit block with noise such as electrical crosstalk.

In the electronic apparatus according to the above one aspect, the ball grid array may further include a sixth ball grid, a source generation signal for generating the source clock may flow through the sixth ball grid, and the sixth ball grid may be located between the first ball grid and the second ball grid.

In the electronic apparatus according to the above one aspect, the ball grid array may further include a seventh ball grid and an eighth ball grid, signals for reference potential of the USB circuit block may flow through the seventh ball grid and the eighth ball grid, the seventh ball grid may be located between the first ball grid and the third ball grid, and the eighth ball grid may be located between the second ball grid and the third ball grid.

Since the seventh ball grid and the eighth ball grid, through which signals for reference potential of the USB circuit block flow, are located respectively between the first ball grid and the third ball grid and between the second ball grid and the third ball grid, the electronic apparatus having this configuration makes it possible to reduce the risk that the signal flowing through the first ball grid, which electrically couples the USB circuit block and the first USB interface to each other, and the signal flowing through the second ball grid, which electrically couples the USB circuit block and the second USB interface to each other, will interfere with the third ball grid, through which the source clock supplied to the USB circuit block flows. Consequently, the risk of contamination of the source clock supplied to the USB circuit block with noise such as electrical crosstalk further decreases.

In the electronic apparatus according to the above one aspect, the ball grid array may further include a ninth ball grid and a tenth ball grid, signals for reference potential of the USB circuit block may flow through the ninth ball grid and the tenth ball grid, the first ball grid may be located between the ninth ball grid and the third ball grid, and the second ball grid may be located between the tenth ball grid and the third ball grid.

With the electronic apparatus having this configuration, it is possible to reduce the risk that a signal different from the signal supplied to the USB circuit block will interfere with the third ball grid, through which the source clock supplied to the USB circuit block flows, the first ball grid, which electrically couples the USB circuit block and the first USB interface to each other, and the second ball grid, which electrically couples the USB circuit block and the second USB interface to each other.

In the electronic apparatus according to the above one aspect, the USB circuit block may support a communication speed of 5 Gbps or faster.

A semiconductor integrated circuit device according to a certain aspect of the present disclosure is configured to be electrically coupled to a printed circuit board, and includes: an integrated circuit board on, over, or in which a USB circuit block is provided; and a ball grid array for electric coupling between the integrated circuit board and the printed circuit board; wherein the ball grid array includes a first ball grid, a second ball grid, and a third ball grid, the first ball grid is electrically coupled to the USB circuit block, the second ball grid is electrically coupled to the USB circuit block, a source clock supplied to the USB circuit block flows through the third ball grid, and the third ball grid is located between the first ball grid and the second ball grid.

With the semiconductor integrated circuit device having this configuration, it is possible to shield the third ball grid, through which the source clock supplied to the USB circuit block flows, by the first ball grid, which is electrically coupled to the USB circuit block, and by the second ball grid, which is electrically coupled to the USB circuit block. The shielding makes it possible to reduce the risk of contamination of the source clock supplied to the USB circuit block with noise such as electrical crosstalk. Moreover, the semiconductor integrated circuit device having this configuration makes it unnecessary to provide any dedicated terminal for shielding the third ball grid, through which the source clock supplied to the USB circuit block flows. Consequently, the possibility of having difficulty in reducing the size of the semiconductor integrated circuit device also decreases.

In the semiconductor integrated circuit device according to the above one aspect, the ball grid array may further include a fourth ball grid and a fifth ball grid, one of a pair of first differential signals supplied to the USB circuit block may flow through the first ball grid, one of a pair of second differential signals supplied to the USB circuit block may flow through the second ball grid, an other of the pair of first differential signals may flow through the fourth ball grid, an other of the pair of second differential signals may flow through the fifth ball grid, the fourth ball grid may be located between the first ball grid and the third ball grid, and the fifth ball grid may be located between the second ball grid and the third ball grid. The semiconductor integrated circuit device having this configuration makes it possible to reduce a difference between the length of a propagation path along which one of the pair of first differential signals flows and the length of a propagation path along which the other flows, thereby improving the precision of the pair of first differential signals. In addition, the semiconductor integrated circuit device having this configuration makes it possible to reduce a difference between the length of a propagation path along which one of the pair of second differential signals flows and the length of a propagation path along which the other flows, thereby improving the precision of the pair of second differential signals.

With the semiconductor integrated circuit device having this configuration, it is possible to shield the third ball grid, through which the source clock supplied to the USB circuit block flows, by the first ball grid, which is electrically coupled to the USB circuit block, and the fourth ball grid, and by the second ball grid, which is electrically coupled to the USB circuit block, and the fifth ball grid. The shielding makes it possible to reduce the risk of contamination of the source clock supplied to the USB circuit block with noise such as electrical crosstalk.

In the semiconductor integrated circuit device according to the above one aspect, the ball grid array may further include a sixth ball grid, a source generation signal for generating the source clock may flow through the sixth ball grid, and the sixth ball grid may be located between the first ball grid and the second ball grid.

In the semiconductor integrated circuit device according to the above one aspect, the ball grid array may further include a seventh ball grid and an eighth ball grid, signals for reference potential of the USB circuit block may flow through the seventh ball grid and the eighth ball grid, the seventh ball grid may be located between the first ball grid and the third ball grid, and the eighth ball grid may be located between the second ball grid and the third ball grid.

Since the seventh ball grid and the eighth ball grid, through which signals for reference potential of the USB circuit block flow, are located respectively between the first ball grid and the third ball grid and between the second ball grid and the third ball grid, the semiconductor integrated circuit device having this configuration makes it possible to reduce the risk that the signal flowing through the first ball grid, which is electrically coupled to the USB circuit block, and the signal flowing through the second ball grid, which is electrically coupled to the USB circuit block, will interfere with the third ball grid, through which the source clock supplied to the USB circuit block flows. Consequently, the risk of contamination of the source clock supplied to the USB circuit block with noise such as electrical crosstalk further decreases.

In the semiconductor integrated circuit device according to the above one aspect, the ball grid array may further include a ninth ball grid and a tenth ball grid, signals for reference potential of the USB circuit block may flow through the ninth ball grid and the tenth ball grid, the first ball grid may be located between the ninth ball grid and the third ball grid, and the second ball grid may be located between the tenth ball grid and the third ball grid.

With the semiconductor integrated circuit device having this configuration, it is possible to reduce the risk that a signal different from the signal supplied to the USB circuit block will interfere with the third ball grid, through which the source clock supplied to the USB circuit block flows, the first ball grid, which is electrically coupled to the USB circuit block, and the second ball grid, which is electrically coupled to the USB circuit block.

In the semiconductor integrated circuit device according to the above one aspect, the USB circuit block may support a communication speed of 5 Gbps or faster.

What is claimed is:

1. An electronic apparatus, comprising:
    an integrated circuit board on, over, or in which a universal serial bus (USB) circuit block is provided;
    a first USB interface;
    a second USB interface;
    a printed circuit board on which first connection wiring electrically coupled to the first USB interface, second connection wiring electrically coupled to the second USB interface, and a source clock circuit configured to output a source clock are provided; and
    a ball grid array that includes a first ball grid, a second ball grid, and a third ball grid for electric coupling between the integrated circuit board and the printed circuit board; wherein
    the first ball grid electrically couples the USB circuit block and the first USB interface to each other via the first connection wiring,
    the second ball grid electrically couples the USB circuit block and the second USB interface to each other via the second connection wiring,
    the third ball grid electrically couples the source clock circuit and the USB circuit block to each other, and
    the third ball grid is located between the first ball grid and the second ball grid.

2. The electronic apparatus according to claim 1, wherein the ball grid array further includes a fourth ball grid and a fifth ball grid,
    one of a pair of first differential signals supplied via the first USB interface flows through the first ball grid,
    one of a pair of second differential signals supplied via the second USB interface flows through the second ball grid,
    an other of the pair of first differential signals flows through the fourth ball grid,
    an other of the pair of second differential signals flows through the fifth ball grid,
    the fourth ball grid is located between the first ball grid and the third ball grid, and
    the fifth ball grid is located between the second ball grid and the third ball grid.

3. The electronic apparatus according to claim 1, wherein the ball grid array further includes a sixth ball grid,
    a source generation signal for generating the source clock flows through the sixth ball grid, and
    the sixth ball grid is located between the first ball grid and the second ball grid.

4. The electronic apparatus according to claim 1, wherein the ball grid array further includes a seventh ball grid and an eighth ball grid,
    signals for reference potential of the USB circuit block flow through the seventh ball grid and the eighth ball grid,
    the seventh ball grid is located between the first ball grid and the third ball grid, and
    the eighth ball grid is located between the second ball grid and the third ball grid.

5. The electronic apparatus according to claim 1, wherein the ball grid array further includes a ninth ball grid and a tenth ball grid,
    signals for reference potential of the USB circuit block flow through the ninth ball grid and the tenth ball grid,
    the first ball grid is located between the ninth ball grid and the third ball grid, and
    the second ball grid is located between the tenth ball grid and the third ball grid.

6. The electronic apparatus according to claim 1, wherein the USB circuit block supports a communication speed of 5 Gbps or faster.

7. A semiconductor integrated circuit device configured to be electrically coupled to a printed circuit board, the semiconductor integrated circuit device comprising:
    an integrated circuit board on, over, or in which a universal serial bus (USB) circuit block is provided; and
    a ball grid array for electric coupling between the integrated circuit board and the printed circuit board; wherein
    the ball grid array includes a first ball grid, a second ball grid, and a third ball grid,
    the first ball grid is electrically coupled to the USB circuit block,
    the second ball grid is electrically coupled to the USB circuit block,
    a source clock supplied to the USB circuit block flows through the third ball grid, and
    the third ball grid is located between the first ball grid and the second ball grid.

8. The semiconductor integrated circuit device according to claim 7, wherein
    the ball grid array further includes a fourth ball grid and a fifth ball grid,
    one of a pair of first differential signals supplied to the USB circuit block flows through the first ball grid,
    one of a pair of second differential signals supplied to the USB circuit block flows through the second ball grid,
    an other of the pair of first differential signals flows through the fourth ball grid,
    an other of the pair of second differential signals flows through the fifth ball grid,
    the fourth ball grid is located between the first ball grid and the third ball grid, and the fifth ball grid is located between the second ball grid and the third ball grid.

9. The semiconductor integrated circuit device according to claim 7, wherein
the ball grid array further includes a sixth ball grid,
a source generation signal for generating the source clock flows through the sixth ball grid, and
the sixth ball grid is located between the first ball grid and the second ball grid.

10. The semiconductor integrated circuit device according to claim 7, wherein
the ball grid array further includes a seventh ball grid and an eighth ball grid,
signals for reference potential of the USB circuit block flow through the seventh ball grid and the eighth ball grid,
the seventh ball grid is located between the first ball grid and the third ball grid, and
the eighth ball grid is located between the second ball grid and the third ball grid.

11. The semiconductor integrated circuit device according to claim 7, wherein
the ball grid array further includes a ninth ball grid and a tenth ball grid,
signals for reference potential of the USB circuit block flow through the ninth ball grid and the tenth ball grid,
the first ball grid is located between the ninth ball grid and the third ball grid, and
the second ball grid is located between the tenth ball grid and the third ball grid.

12. The semiconductor integrated circuit device according to claim 7, wherein
the USB circuit block supports a communication speed of 5 Gbps or faster.

\* \* \* \* \*